(12) United States Patent
Wang

(10) Patent No.: US 11,251,398 B2
(45) Date of Patent: Feb. 15, 2022

(54) ORGANIC LIGHT EMITTING DIODE DISPLAY PANEL AND DISPLAY APPARATUS, FABRICATING METHOD THEREOF

(71) Applicant: BOE Technology Group Co., Ltd., Beijing (CN)

(72) Inventor: Pinfan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 363 days.

(21) Appl. No.: 16/347,612

(22) PCT Filed: Mar. 30, 2018

(86) PCT No.: PCT/CN2018/081380
§ 371 (c)(1),
(2) Date: May 6, 2019

(87) PCT Pub. No.: WO2019/183935
PCT Pub. Date: Oct. 3, 2019

(65) Prior Publication Data
US 2021/0280822 A1    Sep. 9, 2021

(51) Int. Cl.
*H01L 51/52*    (2006.01)
*H01L 51/56*    (2006.01)
*H01L 27/32*    (2006.01)

(52) U.S. Cl.
CPC ...... *H01L 51/5253* (2013.01); *H01L 27/3246* (2013.01); *H01L 27/3283* (2013.01); *H01L 51/56* (2013.01)

(58) Field of Classification Search
CPC .............. H01L 51/5253; H01L 51/56; H01L 27/3246; H01L 27/3283
See application file for complete search history.

(56) References Cited

U.S. PATENT DOCUMENTS

2003/0122495 A1    7/2003    Nakanishi
2005/0200273 A1    9/2005    Nozawa
(Continued)

FOREIGN PATENT DOCUMENTS

CN    1971940 A    5/2007
CN    103178078 A    6/2013
(Continued)

OTHER PUBLICATIONS

International Search Report & Written Opinion dated Jan. 7, 2019, regarding PCT/CN2018/081380.
(Continued)

*Primary Examiner* — Shaun M Campbell
(74) *Attorney, Agent, or Firm* — Intellectual Valley Law, P.C.

(57) ABSTRACT

An organic light emitting diode display panel includes a base substrate; a pixel definition layer for defining a plurality of subpixels on the base substrate; a plurality of organic light emitting diodes respectively in the plurality of subpixels; and a first inorganic encapsulating layer between the base substrate and the pixel definition layer configured to encapsulate the plurality of organic light emitting diodes in the plurality of subpixels. The pixel definition layer includes a plurality of pixel definition blocks spaced apart from each other. The first inorganic encapsulating layer includes a plurality of first inorganic encapsulating blocks, each of the plurality of first inorganic encapsulating blocks is between the base substrate and one of the plurality of pixel definition blocks and configured to encapsulate one of the plurality of organic light emitting diodes in one of the plurality of subpixels.

15 Claims, 24 Drawing Sheets

(56) References Cited

U.S. PATENT DOCUMENTS

| | | |
|---|---|---|
| 2007/0114519 A1 | 5/2007 | Hayashi |
| 2009/0173529 A1 | 7/2009 | Lee et al. |
| 2013/0062635 A1 | 3/2013 | Higo et al. |
| 2013/0161680 A1 | 6/2013 | Gyoo-Chul et al. |
| 2014/0138637 A1 | 5/2014 | Yang et al. |
| 2015/0014636 A1 | 1/2015 | Kang |
| 2016/0028043 A1 | 1/2016 | Kwon et al. |
| 2016/0035806 A1 | 2/2016 | Park et al. |
| 2016/0126499 A1 | 5/2016 | Dai et al. |
| 2016/0190389 A1 | 6/2016 | Lee et al. |
| 2016/0211483 A1 | 7/2016 | Kwon |
| 2016/0260927 A1 | 9/2016 | Oh et al. |
| 2017/0249886 A1 | 8/2017 | Choi |
| 2017/0278920 A1 | 9/2017 | Park et al. |
| 2017/0279057 A1* | 9/2017 | Park .................. H01L 27/326 |
| 2017/0288168 A1 | 10/2017 | Kim et al. |
| 2018/0004016 A1 | 1/2018 | Tada et al. |
| 2018/0175311 A1* | 6/2018 | Jin .................. H01L 27/3258 |
| 2018/0331165 A1 | 11/2018 | Li |
| 2019/0207131 A1* | 7/2019 | Lu .................. H01L 51/5253 |
| 2020/0287146 A1* | 9/2020 | Kim .................. H01L 27/1248 |

FOREIGN PATENT DOCUMENTS

| | | |
|---|---|---|
| CN | 104103766 A | 10/2014 |
| CN | 104769719 A | 7/2015 |
| CN | 107146808 A | 9/2017 |
| CN | 107240596 A | 10/2017 |
| EP | 2863446 B1 | 2/2017 |
| EP | 3321985 A1 | 5/2018 |
| JP | 2013058423 A | 3/2013 |
| JP | 2018004816 A | 1/2018 |
| KR | 20060041975 A | 5/2006 |
| KR | 20130072808 A | 7/2013 |
| KR | 20170110214 A | 10/2017 |
| TW | I370714 B | 7/2009 |

OTHER PUBLICATIONS

First Office Action in the Indian Patent Application No. 201947024799, dated Jul. 17, 2020.
First Office Action in the Korean Patent Application No. 20197018669, dated Aug. 31, 2020. English translation attached.
First Office Action in the Chinese Patent Application No. 201880000242.7, dated Aug. 24, 2021. English translation attached.
First Office Action in the Japanese Patent Application No. 2019536876, dated Nov. 1, 2021. English translation attached.
The Extended European Search Report in the European Patent Application No. 18884854.3, dated Nov. 8, 2021.

* cited by examiner

ORGANIC LIGHT EMITTING DIODE DISPLAY PANEL AND DISPLAY APPARATUS, FABRICATING METHOD THEREOF

CROSS-REFERENCE TO RELATED APPLICATION

This application is a national stage application under 35 U.S.C. § 371 of International Application No. PCT/CN2018/081380, filed Mar. 30, 2018, the contents of which are incorporated by reference in the entirety.

TECHNICAL FIELD

The present invention relates to display technology, more particularly, to an organic light emitting diode display panel and display apparatus, and a fabricating method thereof.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present invention provides an organic light emitting diode display panel comprising a base substrate; a pixel definition layer for defining a plurality of subpixels on the base substrate; a plurality of organic light emitting diodes respectively in the plurality of subpixels; and a first inorganic encapsulating layer between the base substrate and the pixel definition layer configured to encapsulate the duality of organic light emitting diodes in the plurality of subpixels; wherein the pixel definition layer comprises a plurality of pixel definition blocks spaced apart from each other, each of the plurality of pixel definition blocks is configured to define one of the plurality of subpixels; the first inorganic encapsulating layer comprises a plurality of first inorganic encapsulating blocks, each of the plurality of first inorganic encapsulating blocks is between the base substrate and one of the plurality of pixel definition blocks and configured to encapsulate one of the plurality of organic light emitting diodes in one of the plurality of subpixels; and an orthographic projection of each of the plurality of first inorganic encapsulating blocks on the base substrate substantially covers an orthographic projection of a periphery of one of the plurality of organic light emitting diodes on the base substrate.

Optionally, the orthographic projection of each of the plurality of first inorganic encapsulating blocks on the base substrate substantially covers an orthographic projection of one of the plurality of pixel definition blocks on the base substrate.

Optionally, the organic light emitting diode display panel further comprises a second inorganic encapsulating layer on a side of the plurality of organic light emitting diodes and the pixel definition layer distal to the first inorganic encapsulating layer; wherein the second inorganic encapsulating layer is in direct contact with a peripheral part of each of the plurality of first inorganic encapsulating blocks thereby encapsulating the plurality of organic light emitting diodes.

Optionally, the second inorganic encapsulating layer is a continuous layer extending throughout the plurality of subpixels.

Optionally, the second inorganic encapsulating layer comprises a plurality of second inorganic encapsulating blocks; each of the plurality of second inorganic encapsulating blocks is in direct contact with a peripheral part of one of the plurality of first inorganic encapsulating blocks thereby encapsulating the plurality of organic light emitting diodes; and an orthographic projection of each of the plurality of second inorganic encapsulating blocks on the base substrate substantially covers a combination of an orthographic projection of one of the plurality of organic light emitting diodes on the base substrate, an orthographic projection of one of the plurality of first inorganic encapsulating blocks on the base substrate, and an orthographic projection of one of the plurality of pixel definition blocks on the base substrate.

Optionally, the organic light emitting diode display panel is a stretchable display panel having a first substantially non-stretched state and a second stretched state; and adjacent second inorganic encapsulating blocks of the plurality of second inorganic encapsulating blocks are spaced apart by a first gap in the first substantially non-stretched state, and are spaced apart by a second gap in the second stretched state, the second gap has a second gap distance greater than a first gap distance of the first gap.

Optionally, the organic light emitting diode display panel further comprises an organic encapsulating block in the first gap and in the second gap, and attached to a side wall of one of the adjacent second inorganic encapsulating blocks of the plurality of second inorganic encapsulating blocks.

Optionally, the organic light emitting diode display panel further comprises two organic encapsulating blocks in the first gap and in the second gap, each of which attached to a side wall of one of the adjacent second inorganic encapsulating blocks of the plurality of second inorganic encapsulating blocks.

Optionally, the organic light matting diode display panel further comprises an organic encapsulating layer on a side of the second inorganic encapsulating layer distal to the base substrate; wherein the organic encapsulating layer comprises a plurality of first organic encapsulating blocks, each of which at least partially in a subpixel region; and an orthographic projection of each of the plurality of first organic encapsulating blocks on the base substrate substantially covers an orthographic projection of one of the plurality of organic light emitting diodes on the base substrate.

Optionally, the organic encapsulating layer further comprises a plurality of second organic encapsulating blocks in an inter-subpixel region; the second inorganic encapsulating layer comprises a plurality of second inorganic encapsulating blocks; and each of the plurality of second organic encapsulating blocks is in a gap between adjacent second inorganic encapsulating blocks of the plurality of second inorganic encapsulating blocks, and attached to a side wall of one of the adjacent second inorganic encapsulating blocks of the plurality of second inorganic encapsulating blocks.

Optionally, the organic light emitting diode display panel is a stretchable display panel having a first substantially non-stretched state and a second stretched state; adjacent second inorganic encapsulating blocks of the plurality of second inorganic encapsulating blocks are spaced apart by a first gap in the first substantially non-stretched state, and are spaced apart by a second gap in the second stretched state, the second gap has a second gap distance greater than a first gap distance of the first gap; each of the plurality of second organic encapsulating blocks in the first substantially nanstretched state substantially fills in the first gap.

Optionally, the organic encapsulating layer further comprises a plurality of third organic encapsulating blocks in an inter-subpixel region; the second inorganic encapsulating layer comprises a plurality of second inorganic encapsulating blocks; two of the plurality of third organic encapsulating blocks is in a gap between adjacent second inorganic encapsulating blocks of the plurality of second inorganic encapsulating blocks, each of which attached to a side wall of one of the adjacent second inorganic encapsulating blocks of the plurality of second inorganic encapsulating blocks.

Optionally, the organic light emitting diode display panel is a stretchable display panel having a first substantially non-stretched state and a second stretched state; adjacent second inorganic encapsulating blocks of the plurality of second inorganic encapsulating blocks are spaced apart by a first gap in the first substantially non-stretched state, and are spaced apart by a second gap in the second stretched state, the second gap has a second gap distance greater than a first gap distance of the first gap; two of the plurality of third organic encapsulating blocks substantially fills in the first gap in the first substantially non-stretched state.

Optionally, the organic light emitting diode display panel further comprises a third inorganic encapsulating layer on a side of the organic encapsulating layer distal to the base substrate.

Optionally, the third inorganic encapsulating layer is a continuous layer extending throughout the plurality of subpixels.

Optionally, the third inorganic encapsulating layer comprises a plurality of third inorganic encapsulating blocks; each of the plurality of third inorganic encapsulating blocks is in direct contact with the second inorganic encapsulating layer and in direct contact with one of the plurality of first organic encapsulating blocks; an orthographic projection of each of the plurality of third inorganic encapsulating blocks on the base substrate substantially covers a combination of an orthographic projection of one of the plurality of organic light emitting diodes on the base substrate and an orthographic projection of one of the plurality of first organic encapsulating blocks on the base substrate.

Optionally, the organic light emitting diode display panel is a stretchable display panel having a first substantially non-stretched state and a second stretched state; and adjacent third inorganic encapsulating blocks of the plurality of third inorganic encapsulating blocks are spaced apart by a first gap in the first substantially non-stretched state, and are spaced apart by a second gap in the second stretched state, the second gap has a second gap distance greater than a first gap distance of the first gap.

Optionally, adjacent third inorganic encapsulating blocks of the plurality of third inorganic encapsulating blocks are spaced apart by a portion of one or more organic encapsulating blocks in the first gap in the first substantially nanstretched state.

Optionally, the organic light emitting diode display panel is a stretchable display panel having a first substantially non-stretched state and a second stretched state; and adjacent third inorganic encapsulating blocks of the plurality of third inorganic encapsulating blocks are in direct contact with each other in the first substantially non-stretched state, and are spaced apart by a gap in the second stretched state.

Optionally, the base substrate is a stretchable base substrate, and the organic light emitting diode display panel is a stretchable organic light emitting diode display panel.

In another aspect, the present invention provides an organic light emitting diode display panel comprising a base substrate; a pixel definition layer for defining a plurality of subpixels on the base substrate; a plurality of organic light emitting diodes respectively in the plurality of subpixels; a first inorganic encapsulating layer between the base substrate and the pixel definition layer configured to encapsulate the plurality of organic light emitting diodes in the plurality of subpixels; a second inorganic encapsulating layer on a side of the plurality of organic light emitting diodes and the pixel definition layer distal to the first inorganic encapsulating layer; an organic encapsulating layer on a side of the second inorganic encapsulating layer distal to the base substrate; and a third inorganic encapsulating layer on a side of the organic encapsulating layer distal to the base substrate.

Optionally, the pixel definition layer comprises a plurality of pixel definition blocks spaced apart from each other, each of the plurality of pixel definition blocks is configured to define one of the plurality of subpixels; the first inorganic encapsulating layer comprises a plurality of first inorganic encapsulating blocks, each of the plurality of first inorganic encapsulating blocks is between the base substrate and one of the plurality of pixel definition blocks and configured to encapsulate one of the plurality of organic light emitting diodes in one of the plurality of subpixels; an orthographic projection of each of the plurality of first inorganic encapsulating blocks on the base substrate substantially covers an orthographic projection of a periphery of one of the plurality of organic light emitting diodes on the base substrate; the second inorganic encapsulating layer is in direct contact with a peripheral part of each of the plurality of first inorganic encapsulating blocks thereby encapsulating the plurality of organic light omitting diodes; the organic encapsulating layer comprises a plurality of first organic encapsulating blocks, each of which at least partially in a subpixel region; and an orthographic projection of each of the plurality of first organic encapsulating blocks on the base substrate substantially covers an orthographic projection of one of the plurality of organic light emitting diodes on the base substrate.

In another aspect, the present invention provides an organic light emitting diode display apparatus comprising the organic light emitting diode display panel described herein or fabricated by a method described herein.

Optionally, the organic light emitting diode display apparatus is a wearable display apparatus.

In another aspect, the present invention provides a method of fabricating an organic light emitting diode display panel, composing forming a pixel definition layer for defining a plurality of subpixels on a base substrate; forming a plurality of organic light emitting diodes respectively in the plurality of subpixels; and forming a first inorganic encapsulating layer between the base substrate and the pixel definition layer configured to encapsulate the plurality of organic light emitting diodes in the plurality of subpixels, wherein forming the pixel definition layer comprises forming a plurality of pixel definition blocks spaced apart from each other, each of the plurality of pixel definition blocks is formed to define one of the plurality of subpixels; forming the first inorganic encapsulating layer comprises forming a plurality of first inorganic encapsulating blocks, each of the plurality of first inorganic encapsulating blocks is formed between the base substrate and one of the plurality of pixel definition blocks and formed to encapsulate one of the plurality of organic light emitting diodes in one of the plurality of subpixels; and the first inorganic encapsulating layer is formed so that an orthographic projection of each of the plurality of first inorganic encapsulating blocks on the base substrate substantially covers an orthographic projection of a periphery of one of the plurality of organic light emitting diodes on the base substrate.

Optionally, the first inorganic encapsulating layer is formed so that the orthographic projection of each of the plurality of first inorganic encapsulating blocks on the base substrate substantially covers an orthographic projection of one of the plurality of pixel definition blocks on the base substrate.

Optionally, the method further comprises forming a second inorganic encapsulating layer on a side of the plurality of organic light emitting diodes and the pixel definition layer distal to the first inorganic encapsulating layer; wherein the second inorganic encapsulating layer is formed to be in direct contact with a peripheral part of each of the plurality of first inorganic encapsulating blocks thereby encapsulating the plurality of or game light emitting diodes.

Optionally, the second inorganic encapsulating layer is formed as a continuous layer extending throughout the plurality of subpixels.

Optionally, forming the second inorganic encapsulating layer comprises forming a plurality of second inorganic encapsulating blocks; each of the plurality of second inorganic encapsulating blocks is formed to be in direct contact with a peripheral part of one of the plurality of first inorganic encapsulating blocks thereby encapsulating the plurality of organic light emitting diodes; and the second inorganic encapsulating layer is formed so that an orthographic projection of each of the plurality of second inorganic encapsulating blocks on the base substrate substantially covers a combination of an orthographic projection of one of the plurality of organic light emitting diodes on the base substrate, an orthographic projection of one of the plurality of first inorganic encapsulating blocks on the base substrate, and an orthographic projection of one of the plurality of pixel definition blocks on the base substrate.

Optionally, the method further comprises forming an organic encapsulating layer on a side of the second inorganic encapsulating layer distal to the base substrate; wherein forming the organic encapsulating layer comprises forming a plurality of first organic encapsulating blocks, each of which at least partially in a subpixel region; and the organic encapsulating layer is formed so that an orthographic projection of each of the plurality of first organic encapsulating blocks on the base substrate substantially covers an orthographic projection of one of the plurality of organic light emitting diodes on the base substrate.

Optionally, forming the organic encapsulating layer further comprises forming a plurality of second organic encapsulating blocks in an inter-subpixel region; forming the second inorganic encapsulating layer comprises forming a plurality of second inorganic encapsulating blocks; and the organic encapsulating layer is formed so that each of the plurality of second organic encapsulating blocks is in a gap between adjacent second inorganic encapsulating blocks of the plurality of second inorganic encapsulating blocks, and attached to a side wall of one of the adjacent second inorganic encapsulating blocks of the plurality of second inorganic encapsulating blocks.

Optionally, forming the organic encapsulating layer further comprises forming a plurality of third organic encapsulating blocks in an inter-subpixel region; forming the second inorganic encapsulating layer comprises forming a plurality of second inorganic encapsulating blocks; the organic encapsulating layer is formed so that two of the plurality of third organic encapsulating blocks is in a gap between adjacent second inorganic encapsulating blocks of the plurality of second inorganic encapsulating blocks, each of which attached to a side wall of one of the adjacent second inorganic encapsulating blocks of the plurality of second inorganic encapsulating blocks.

Optionally, the method further comprises forming a third inorganic encapsulating layer on a side of the organic encapsulating layer distal to the base substrate.

Optionally, the third inorganic encapsulating layer is formed as a continuous layer extending throughout the plurality of subpixels.

Optionally, forming the third inorganic encapsulating layer comprises forming a plurality of third inorganic encapsulating blocks; each of the plurality of third inorganic encapsulating blocks is formed to be in direct contact with the second inorganic encapsulating layer and in direct contact with one of the plurality of first organic encapsulating blocks; the third inorganic encapsulating layer is formed so that an orthographic projection of each of the plurality of third inorganic encapsulating blocks on the base substrate substantially covers a combination of an orthographic projection of one of the plurality of organic light emitting diodes on the base substrate and an orthographic projection of one of the plurality of first organic encapsulating blocks on the base substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an organic light emitting diode display panel and display apparatus, and a fabricating method thereof that substantially obviate one or more of the problems due to limitations and disadvantages of the related art. In one aspect, the present disclosure provides an organic light emitting diode display panel. In some embodiments, the organic light emitting diode display panel includes a base substrate; a pixel definition layer for defining a plurality of subpixels on the base substrate; a plurality of organic light emitting diodes respectively in the plurality of subpixels; and a first inorganic encapsulating layer between the base substrate and the pixel definition layer configured to encapsulate the plurality of organic light emitting diodes in the plurality of subpixels. Optionally, the pixel definition layer includes a plurality of pixel definition blocks spaced apart from each other. Optionally, each of the plurality of pixel definition blocks is configured to define one of the plurality of subpixels. Optionally, the first inorganic encapsulating layer includes a plurality of first inorganic encapsulating blocks. Optionally, each of the plurality of first inorganic encapsulating blocks is between the base substrate and one of the plurality of pixel definition blocks and configured to encapsulate one of the plurality of organic light emitting diodes in one of the plurality of subpixels. Optionally, an orthographic projection of each of the plurality of first inorganic encapsulating blocks on the base substrate substantially covers an orthographic projection of a periphery of one of the plurality of organic light emitting diodes on the base substrate.

Optionally, the organic light emitting diode display panel is a stretchable organic light emitting diode display panel. Optionally, the organic light emitting diode display panel is a flexible organic light emitting diode display panel. Optionally, the organic light emitting diode display panel is a rollable organic light emitting diode display panel. Optionally, the organic light emitting diode display panel is a foldable organic light emitting diode display panel. Optionally, the organic light emitting diode display panel is a display panel in a wearable apparatus. As used herein, the term "stretchable" refers to one or more of the length, width and thickness of the organic light emitting diode display panel can be reversibly increased by the application of an external force on the organic light emitting diode display panel.

Figure 1A:
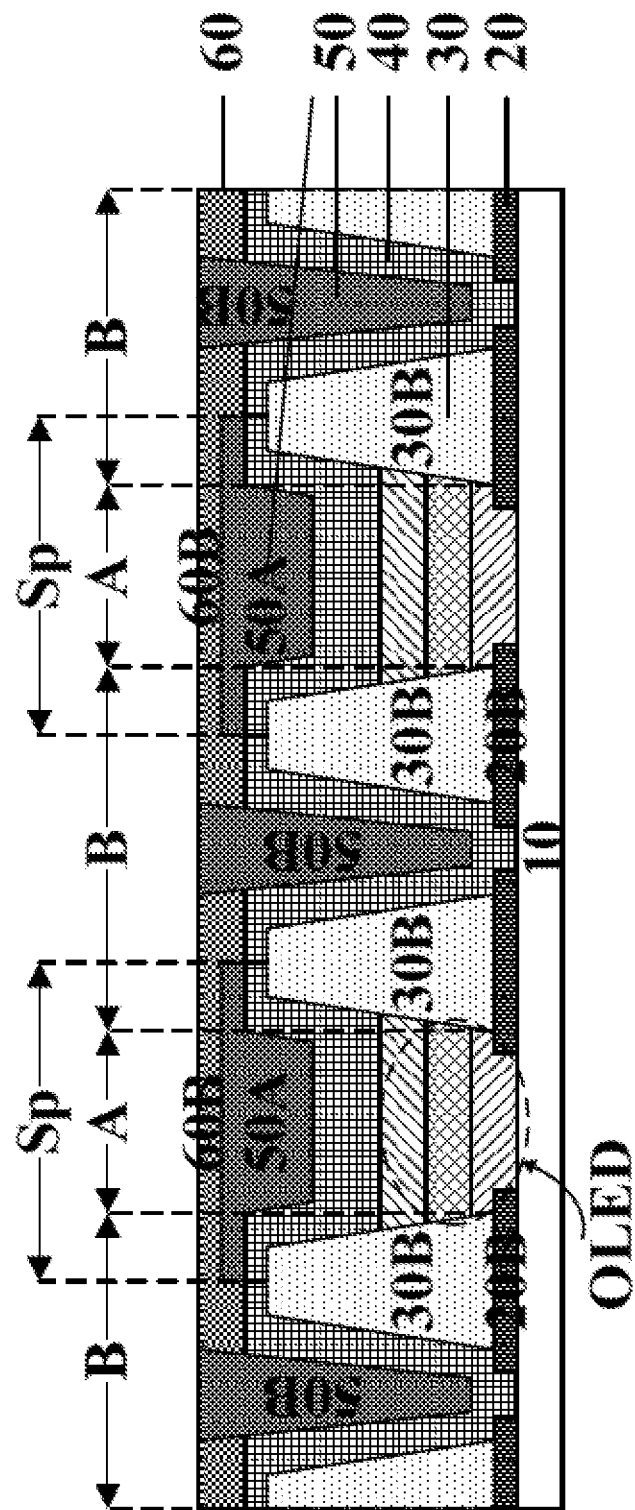
FIG. 1A is a schematic diagram illustrating an organic light emitting diode display panel in some embodiments according to the present disclosure.

FIG. 1A is a schematic diagram illustrating an organic light emitting diode display panel in some embodiments according to the present disclosure. Referring to FIG. 1A, the organic light emitting diode display panel in some embodiments includes a plurality of subpixels Sp, and has a subpixel region A and an inter-subpixel region B. The organic light emitting diode display panel depicted in FIG. 1A in some embodiments is an organic light emitting diode display panel in a substantially unused state. For example, the organic light emitting diode display panel depicted in FIG. 1A may be a stretchable organic light emitting diode display panel that has been fabricated but have not been used. For example, one or more of the encapsulating layers of the organic light emitting diode display panel may be a continuous layer, the continuous layer has not been stretched and separated into a plurality of encapsulating blocks. In the context of the present disclosure, the state in which the organic light emitting diode display panel that has been fabricated but have not been used (e.g., stretched) may be referred to as an "initial state".

As used herein, a subpixel region refers to a light emission region of a subpixel, such as a region corresponding to a pixel electrode in a liquid crystal display, or a region corresponding to a light emissive layer in an organic light emitting diode display panel. Optionally, a pixel may includes a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, as inter-subpixel region refers to a region between adjacent subpixel regions, such as a region corresponding to a black matrix in a liquid crystal display, or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of on adjacent green color subpixel. Optionally, the inter-subpixel region is a region between a subpixel region of a red color subpixel a subpixel region of on adjacent blue color subpixel. Optionally, the inter-subpixel region is a region between a subpixel region of a green color subpixel and a subpixel region of on adjacent blue color subpixel.

Referring to FIG. 1A, the organic light emitting diode display panel in some embodiments includes a base substrate 10; a pixel definition layer 30 for defining a plurality of subpixels Sp on the base substrate 10; a plurality of organic light emitting diodes OLED respectively in the plurality of subpixels Sp; and a first inorganic encapsulating layer 20 between the base substrate 10 and the pixel definition layer 30 configured to encapsulate the plurality of organic light emitting diodes OLED in the plurality of subpixels Sp, e.g., from the bottom side of the plurality of organic light emitting diodes OLED. Each of the plurality of organic light emitting diodes OLED at the bottom side (e.g., around the anode of the plurality of organic light emitting diodes OLED) is surrounded by the pixel definition layer 30, the base substrate 10 (e.g., a passivation layer in the organic light emitting diode display panel), and the first inorganic encapsulating layer 20.

In some embodiments, the pixel definition layer 30 includes a plurality of pixel definition blocks 30B spaced apart from each other. Optionally, each of the plurality of pixel definition blocks 30B is configured to define one of the plurality of subpixels Sp. Optionally, each of the plurality of pixel definition blocks surrounds a periphery of one of the plurality of subpixels Sp. Optionally, the organic light emitting diode display panel is a stretchable organic light emitting diode display panel. When the organic light emitting diode display panel is stretched, each of the plurality of organic light emitting diodes OLED is surrounded and protected by one of the plurality of pixel definition blocks 30B, remains intact during the stretching process.

Each of the plurality of pixel definition blocks 30B may have any appropriate shapes. Optionally, each of the plurality of pixel definition blocks 30B has a hollow cylindrical shape, with its inner wall surrounding one of the plurality of organic light emitting diodes OLED. Optionally, the hollow cylindrical shape is a rectangular hollow cylindrical shape. Optionally, the hollow cylindrical shape is a square hollow cylindrical shape. Optionally, the hollow cylindrical shape is a circular hollow cylindrical shape.

In some embodiments, the first inorganic encapsulating layer 20 includes a plurality of first inorganic encapsulating blocks 20B. Optionally, each of the plurality of first inorganic encapsulating blocks 20B is between the base substrate 10 and one of the plurality of pixel definition blocks 30B, and configured to encapsulate one of the plurality of organic light emitting diodes OLED in one of the plurality of subpixels Sp, e.g., from the bottom side. Optionally, an orthographic projection of each of the plurality of first inorganic encapsulating blocks 20B on the base substrate 10 substantially covers an orthographic projection of a periphery of one of the plurality of organic light emitting diodes OLED on the base substrate 10, e.g., the orthographic projection of each of the plurality of first inorganic encapsulating blocks 20B on the base substrate 10 substantially covets an orthographic projection of a periphery of at least one layer in one of the plurality of organic light emitting diodes OLED on the base substrate 10. Optionally, an orthographic projection of the first inorganic encapsulating layer 20 on the base substrate 10 substantially covers an orthographic projection of the pixel definition layer 30 on the base substrate 10. Optionally, the orthographic projection of each of the plurality of first inorganic encapsulating blocks 20B an the base substrate 10 substantially covers an orthographic projection of one of the plurality of pixel definition blocks 30B on the base substrate 10.

In some embodiments, each of the plurality of organic light emitting diodes OLED includes a first electrode (e.g., on anode), a second electrode (e.g., a cathode), an organic light emitting layer between the first electrode and the second electrode. Optionally, each of the plurality of organic light emitting diodes OLED further includes one or more functional organic layers between the first electrode and the second electrode. Optionally, the second electrode is on a side of the organic light emitting layer distal to the first electrode. Optionally, an orthographic projection of each of the plurality of first inorganic encapsulating blocks 20B on the base substrate 10 substantially covers an orthographic projection of a periphery of the first electrode in one of the plurality of organic light emitting diodes OLED on the base substrate 10. Optionally, an orthographic projection of each of the plurality of first inorganic encapsulating blocks 20B on the base substrate 10 substantially covers an orthographic projection of a periphery of the second electrode in one of the plurality of organic light emitting diodes OLED on the base substrate 10. Optionally, an orthographic projection of each of the plurality of first inorganic encapsulating blocks 20B on the base substrate 10 substantially covers an orthographic projection of a periphery of the organic light emitting layer in one of the plurality of organic light emitting diodes OLED on the base substrate 10. Optionally, an orthographic projection of each of the plurality of first inorganic encapsulating blocks 20B on the base substrate 10 substantially covers an orthographic projection of a periphery of any layer in one of the plurality of organic tight emitting diodes OLED on the base substrate 10. Optionally, an orthographic projection of each of the plurality of first inorganic encapsulating blocks 20B on the base substrate 10 is substantially non-overlapping with an orthographic projection of one or more layers in one of the plurality of organic light emitting diodes OLED on the base substrate 10, but substantially covets an orthographic projection of a periphery of other layers in the one of the plurality of organic light emitting diodes OLED on the base substrate 10.

Each of the plurality of first inorganic encapsulating blocks 20B may have any appropriate shapes. Optionally, each of the plurality of first inorganic encapsulating blocks 20B has a ring shape, with its inner side surrounding one of the plurality of organic light emitting diodes OLED. Optionally, the ring shape is a rectangular ring shape. Optionally, the ring shape is a square ring shape. Optionally, the ring shape is a circular ring shape.

In some embodiments, the organic light emitting diode display panel further includes a second inorganic encapsulating layer 40 on a side of the plurality of organic light emitting diodes OLED and the pixel definition layer 30 distal to the first inorganic encapsulating layer 20. As shown in FIG. 1A, in some embodiments, the second inorganic encapsulating layer 40 is in direct contact with a peripheral pact of each of the plurality of first inorganic encapsulating blocks 20B thereby encapsulating the plurality of organic light emitting diodes OLED. Optionally, the second inorganic encapsulating layer 40 is in direct contact with an entirety of the peripheral part of each of the plurality of first inorganic encapsulating blocks 20B thereby encapsulating the plurality of organic light emitting diodes OLED.

In the initial state, as shown in FIG. 1A, the second inorganic encapsulating layer 40 in some embodiments is a continuous layer extending throughout the plurality of subpixels Sp. Optionally, the second inorganic encapsulating layer 40 extends into a region between adjacent first mar game encapsulating blocks of the plurality of first inorganic encapsulating blocks 20B, and is in direct contact with the base substrate 10 (e.g., a passivation layer of the organic light emitting diode display panel).

In some embodiments, the organic light emitting diode display panel further includes an organic encapsulating layer 50 on a side of the second inorganic encapsulating layer 40 distal to the base substrate 10 for further encapsulating the plurality of organic light emitting diodes OLED. Optionally, the organic encapsulating layer 50 includes a plurality of organic encapsulating blocks. In some embodiments, the organic encapsulating layer 50 includes a plurality of first organic encapsulating blocks 50A. Optionally, each of the plurality of first organic encapsulating blocks 50A at least partially in a subpixel region A. Optionally, an orthographic projection of each of the plurality of first organic encapsulating blocks 30A on the base substrate 10 substantially covers an orthographic projection of one of the plurality of organic light emitting diodes OLED on the base substrate 10.

In some embodiments, the organic encapsulating layer 50 includes a plurality of second organic encapsulating blocks 50B in an inter-subpixel region B. Each of the plurality of second organic encapsulating blocks 50B is on a side of the second inorganic encapsulating layer 40 distal to the base substrate 10 in the inter-subpixel region B. Each of the plurality of second organic encapsulating blocks 50B protrudes into a recess formed by walls of the second inorganic encapsulating layer 40 in the inter-subpixel region B. Each of the plurality of second organic encapsulating blocks 30B is attached to the walls of the second inorganic encapsulating layer 40 in the inter-subpixel region B defining the recess.

In some embodiments, the organic light emitting diode display panel further includes a third inorganic encapsulating layer 60 on a side of the organic encapsulating layer 30 dismal to the base substrate 10. As shown in FIG. 1A, the third inorganic encapsulating layer 60 in some embodiments includes a plurality of third inorganic encapsulating blocks 60B. Optionally, each of the plurality of third inorganic encapsulating blocks 60B is in direct contact with the second inorganic encapsulating layer 40 and in direct contact with one of the plurality of first organic encapsulating blocks 50A. Optionally, an orthographic projection of each of the plurality of third inorganic encapsulating blocks 60B on the base substrate 10 substantially covers an orthographic projection of one of the plurality of organic light emitting diodes OLED on the base substrate 10 and also covers an orthographic projection of one of the plurality of first organic encapsulating blocks 50A on the base substrate 10.

Figure 1B:
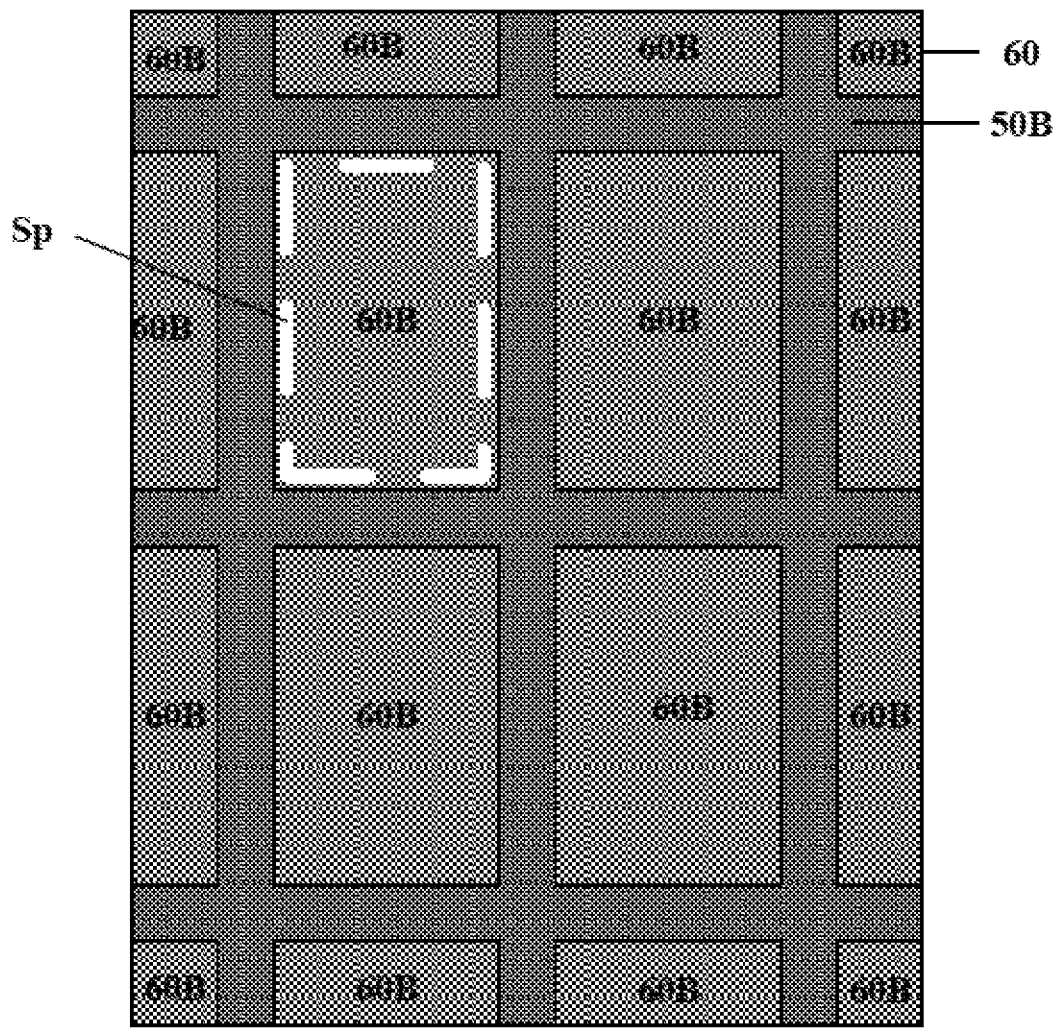
FIG. 1B is a plan view of the organic light emitting diode display panel in some embodiments according to the present disclosure.

FIG. 1B is plan view of the organic light emitting diode display panel in some embodiments according to the present disclosure. Referring to FIG. 1A and FIG. 1B, the organic light emitting diode display panel in the initial state includes a plurality of third inorganic encapsulating blocks 60B spaced apart from each other by the plurality of second organic encapsulating blocks 50B in the inter-subpixel region B. Optionally, the plurality of second organic encapsulating blocks 50B in the inter-subpixel region B form a network extending throughout the plurality of subpixels Sp.

In some embodiments, the organic light emitting diode display panel is a stretchable display panel having a first substantially non-stretched state and a second stretched state. In the first substantially nan-stretched state, the organic light emitting diode display panel is substantially free of application of external force, e.g., in a relaxed state. In the second stretched state; the organic light emitting diode display panel is subject to an external force, e.g., to stretch the organic light emitting diode display panel in one or more dimensions. In the initial state, the organic light emitting diode display panel is never stretched. Once the organic light emitting diode display panel is stretched, one or more continuous encapsulating layer of the organic light emitting diode display panel may be torn open and be separated into a plurality of encapsulating blocks. For example, the second inorganic encapsulating layer 40 in FIG. 1A is a continuous encapsulating layer in the initial state. Once the organic light emitting diode display panel is stretched, the second inorganic encapsulating layer 40 may be tom apart into a plurality of second inorganic encapsulating blocks.

Figure 1C:
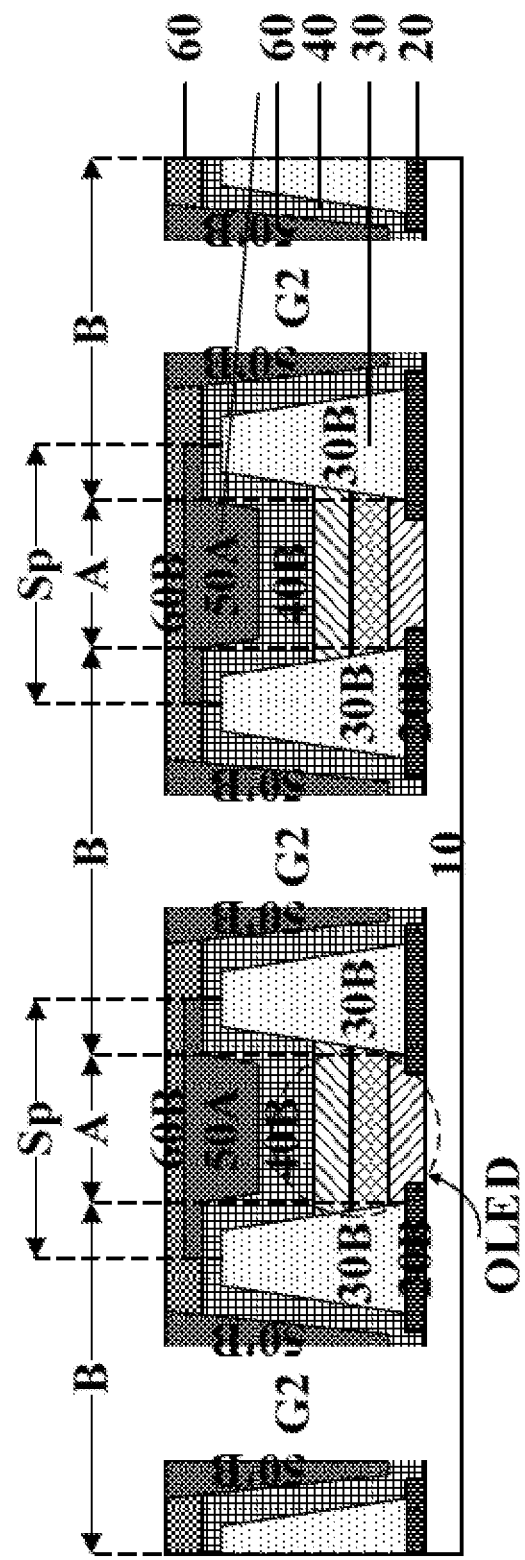
FIG. 1C is a schematic diagram illustrating an organic light emitting diode display panel in a stretched state in some embodiments according to the present disclosure.

FIG. 1C is a schematic diagram illustrating an organic light diode display panel in a stretched state in some embodiments according to the present disclosure. Refining to FIG. 1C, the second inorganic encapsulating layer 40 is separated into a plurality of second inorganic encapsulating blocks 40B. Optionally, each of the plurality of second inorganic encapsulating blocks 40B is in direct contact with a peripheral part (e.g., an entirety of the peripheral part) of one of the plurality of first inorganic encapsulating blocks 20B thereby encapsulating the plurality of organic light emitting diodes OLED. Optionally, an orthographic projection of each of the plurality of second inorganic encapsulating blocks 40B on the base substrate 10 substantially covers an orthographic projection of one of the plurality of organic light emitting diodes OLED cm the base substrate 10, covers an orthographic projection of one of the plurality of first inorganic encapsulating blocks 20B on the base substrate 10, and also covers an orthographic projection of one of the plurality of pixel definition blocks 30B on the base substrate 10.

Figure 1D:
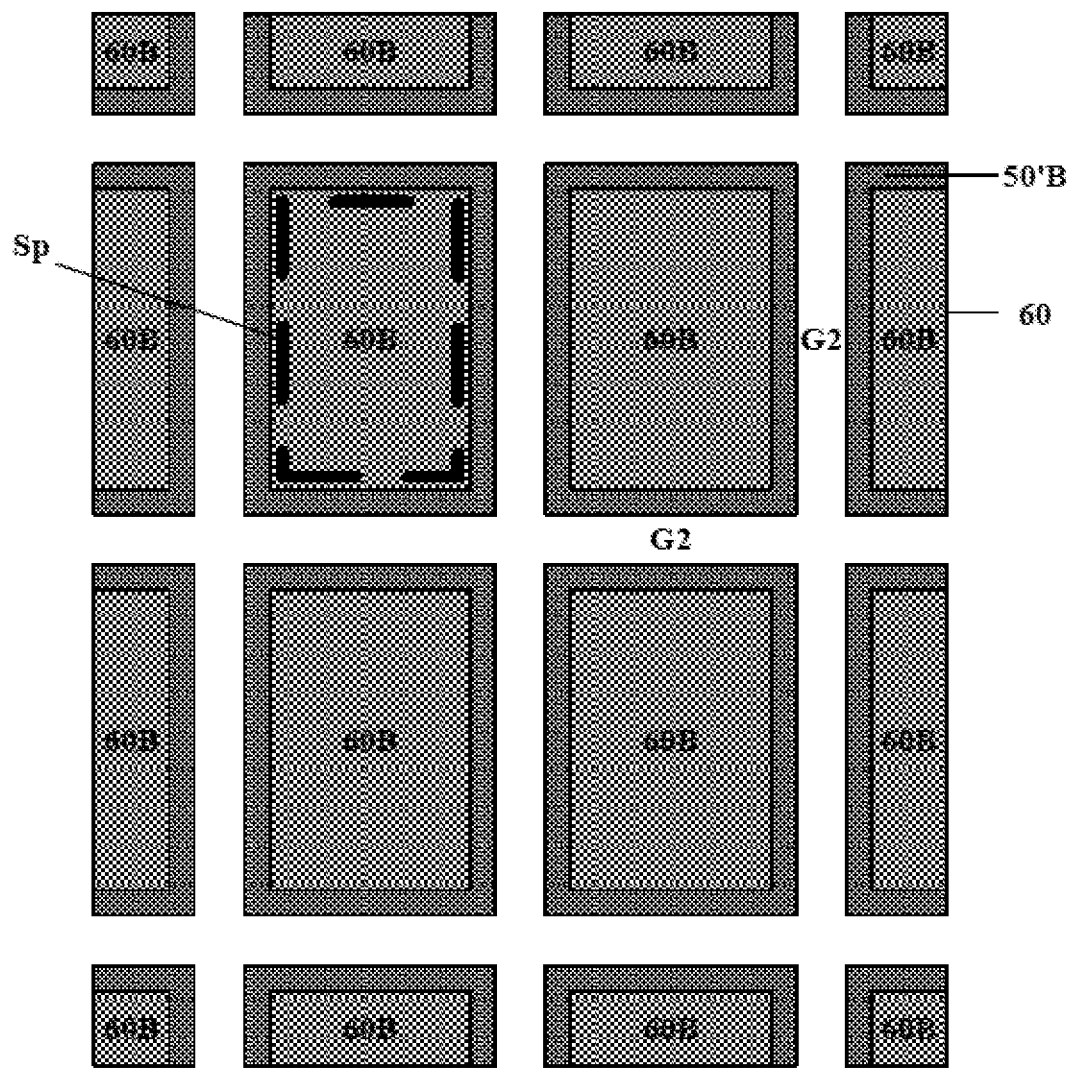
FIG. 1D is plan, view of the organic light emitting diode display panel in a stretched state in some embodiments according to the present disclosure.

As shown in FIG. 1C, adjacent second inorganic encapsulating blocks of the plurality of second inorganic encapsulating blocks 40B are spaced apart by a second gap G2 in the second stretched state. FIG. 1D is plan view of the organic light emitting diode display panel in a stretched state in some embodiments according to the present disclosure. Refining to FIG. 1D, adjacent subpixels of the plurality of subpixels Sp are spaced apart by the second gap G2 in the second stretched state. Adjacent third inorganic encapsulating blocks of the plurality of third inorganic encapsulating blocks 60B are spaced apart by the second gap G2 in the second stretched state.

In some embodiments, when the organic light emitting diode display panel is stretched from the initial state to the second stretched state, one or mote of the plurality of second organic encapsulating blocks 50B are tom apart into two pieces. In one example, the plurality of second organic encapsulating blocks 50B is made of a relatively brittle organic material, and each of the plurality of second organic encapsulating blocks 50B is tom apart into two of a plurality of third organic encapsulating blocks 50'B. The organic light emitting diode display panel includes two of the plurality of third organic encapsulating blocks 50'B in the second gap G2 between adjacent second inorganic encapsulating blocks of the plurality of second inorganic encapsulating blocks 40B. Each of the two of the plurality of third organic encapsulating blocks 50'B is attached to a side wall of one of the adjacent second inorganic encapsulating blocks of the plurality of second inorganic encapsulating blocks 40B.

As shown in FIG. 1D, in some embodiments, each of the plurality of third inorganic encapsulating blocks 60B is surrounded by a portion of one of the plurality of third organic encapsulating blocks 50'B in the second stretched state. Adjacent third organic encapsulating blocks of the plurality of third organic encapsulating blocks 50'B are spaced apart by the second gap G2 in the second stretched state.

Figure 1E:
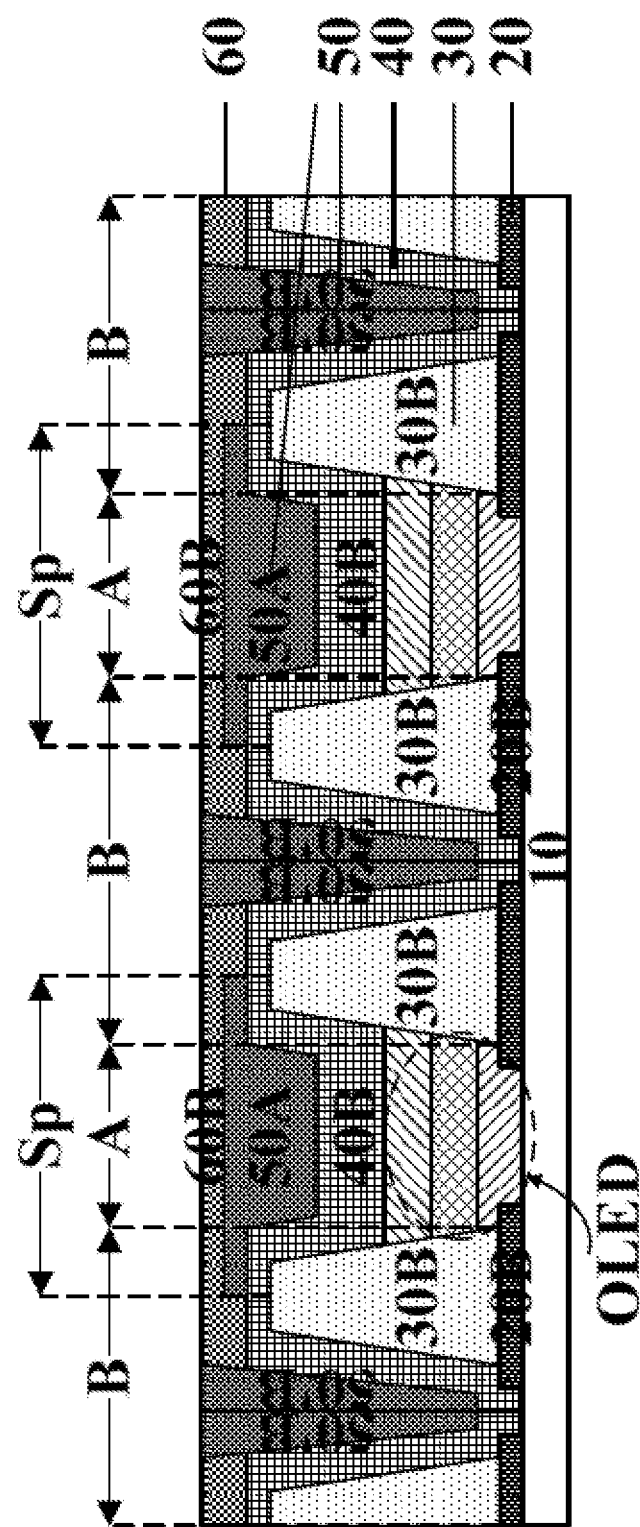
FIG. 1E is a schematic diagram illustrating an organic light emitting diode display panel in a substantially non-stretched state in some embodiments according to the present disclosure.

FIG. 1E is a schematic diagram illustrating an organic light emitting diode display panel in a substantially nan-stretched state in some embodiments according to the present disclosure. Refining to FIG. 1E, adjacent second inorganic encapsulating blocks of the plurality of second inorganic, encapsulating blocks 40B are spaced apart by two of the plurality of third organic encapsulating blocks 50'B in the first substantially non-stretched state. Alternatively, the organic-light emitting diode display panel in the first substantially non-stretched state can be viewed as to have a first gap spacing apart adjacent second inorganic encapsulating blocks of the plurality of second inorganic encapsulating blocks 40B, the two of the plurality of third organic encapsulating blocks 50'B fills in the first gap. The first gap has a first gap distance less than a second gap distance of the second gap G2. Thus, adjacent second inorganic encapsulating blocks of the plurality of second inorganic encapsulating blocks 40B are spaced apart by a portion of two of the plurality of third organic encapsulating blocks 50'B in the first gap in the first substantially non-stretched state. As used herein, the term "gap distance" refers to a distance between adjacent encapsulating blocks, e.g., adjacent second inorganic encapsulating blocks of the plurality of second inorganic encapsulating blocks 40B.

Figure 1F:
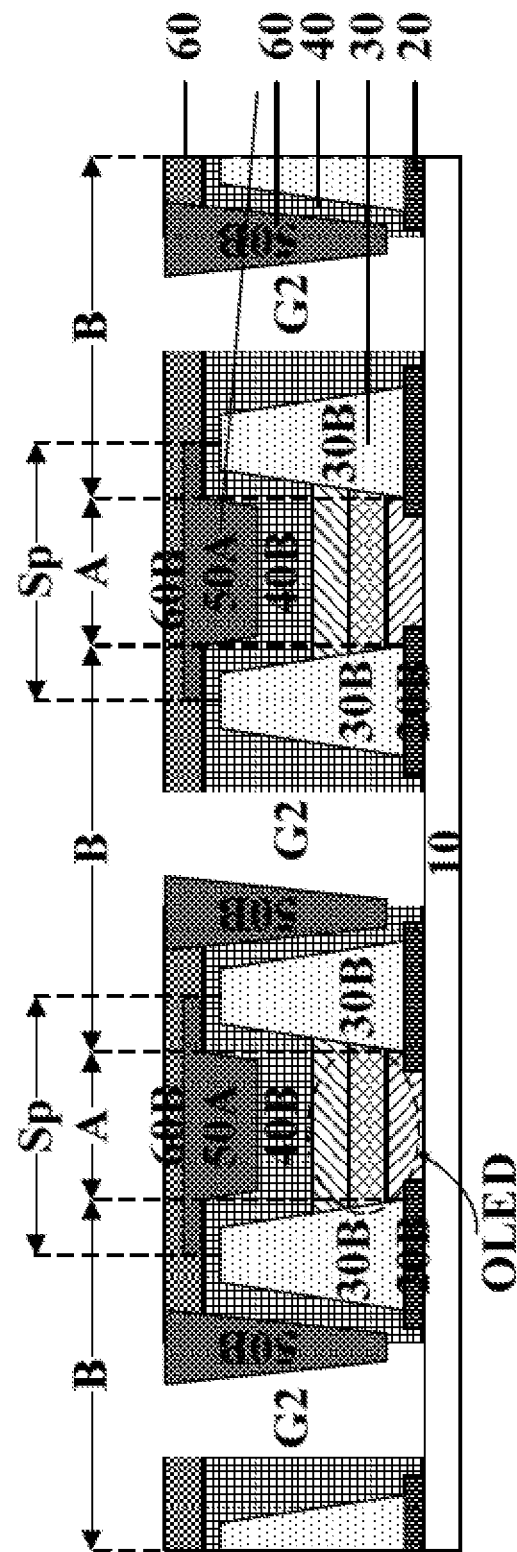
FIG. 1F is a schematic diagram illustrating an organic light omitting diode display panel in a stretched state in some embodiments according to the present disclosure.

FIG. 1F is a schematic diagram illustrating an organic light omitting diode display panel in a stretched state in some embodiments according to the present disclosure. Referring to FIG. 1F, the plurality of second organic encapsulating blocks 50B is made of a relatively flexible organic material, and each of the plurality of second organic encapsulating blocks 50B is not torn apart in the middle of the block. Rather, when the organic light emitting diode display panel is stretched from the initial state to the second stretched state, each of the plurality of second organic encapsulating blocks 50B is separated from one of two adjacent second inorganic encapsulating blocks of the plurality of second inorganic encapsulating blocks 40B, and remains attached to another one of the two adjacent second inorganic encapsulating blocks of the plurality of second inorganic encapsulating blocks 40B.

Referring to FIG. 1F, the organic light emitting diode display panel further includes one of the plurality of second organic encapsulating blocks 50B in the second gap G2. Optionally, the one of the plurality of second organic encapsulating blocks 50B in the second gap G2 is attached to a side wall of one of the adjacent second inorganic encapsulating blocks of the plurality of second inorganic encapsulating blocks 40B.

Figure 1G:
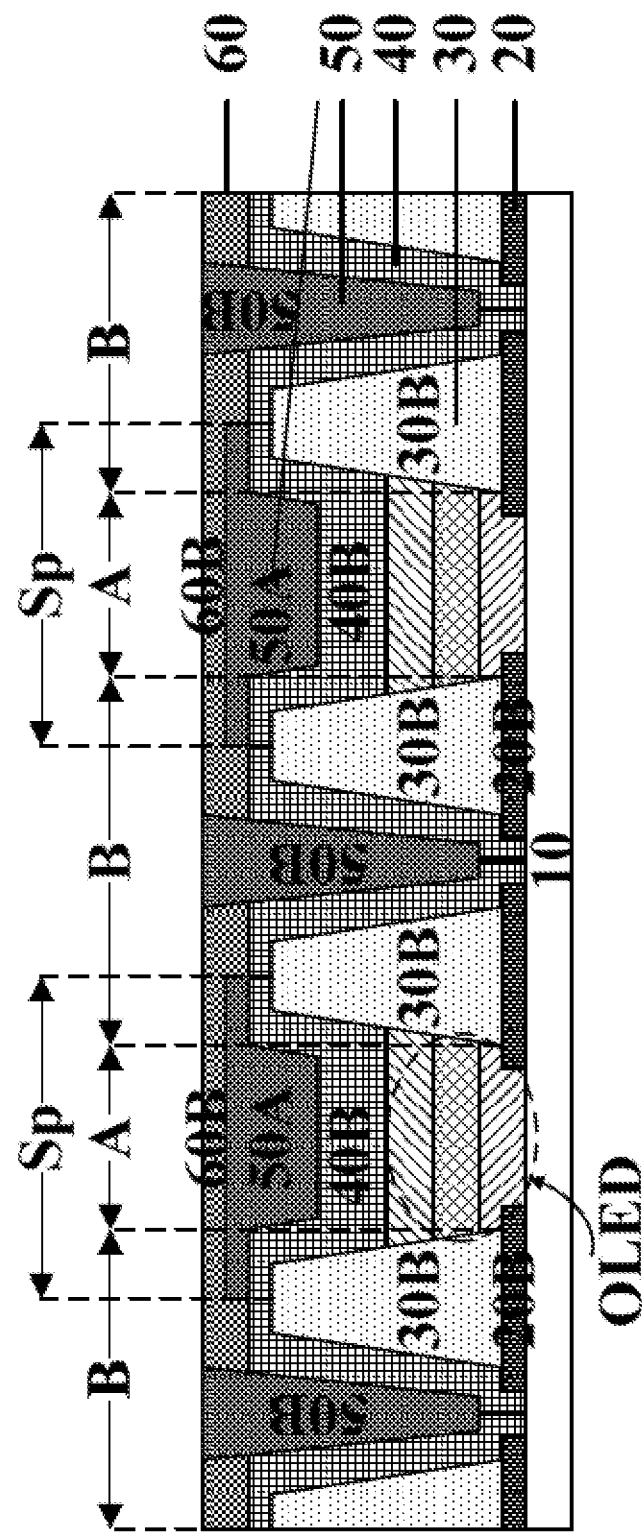
FIG. 1G is a schematic diagram illustrating an organic light emitting diode display panel in a substantially non-stretched state in some embodiments according to the present disclosure.

FIG. 1G is a schematic diagram illustrating an organic light matting diode display panel in a substantially nan-stretched state in some embodiments according to the present disclosure. Referring to FIG. 1G, adjacent second inorganic encapsulating blocks of the plurality of second inorganic, encapsulating blocks 40B are spaced apart by one of the plurality of second organic encapsulating blocks 50B in the first substantially non-stretched state. Alternatively, the organic light emitting diode display panel in the first substantially non-stretched state can be viewed as to have a first gap spacing apart adjacent second inorganic encapsulating blocks of the plurality of second inorganic encapsulating blocks 40B, the one of the plurality of second organic encapsulating blocks 50B fills in the first gap. The first gap has a first gap distance less than a second gap distance of the second gap G2. Thus, adjacent second inorganic encapsulating blocks of the plurality of second inorganic encapsulating blocks 40B are spaced apart by a portion of one of the plurality of second organic encapsulating blocks 50B in the first gap in the first substantially non-stretched state. As used herein, the term "gap distance" refers to a distance between adjacent encapsulating blocks, e.g., adjacent second inorganic encapsulating blocks of the plurality of second inorganic encapsulating blocks 40B.

Figure 2A:
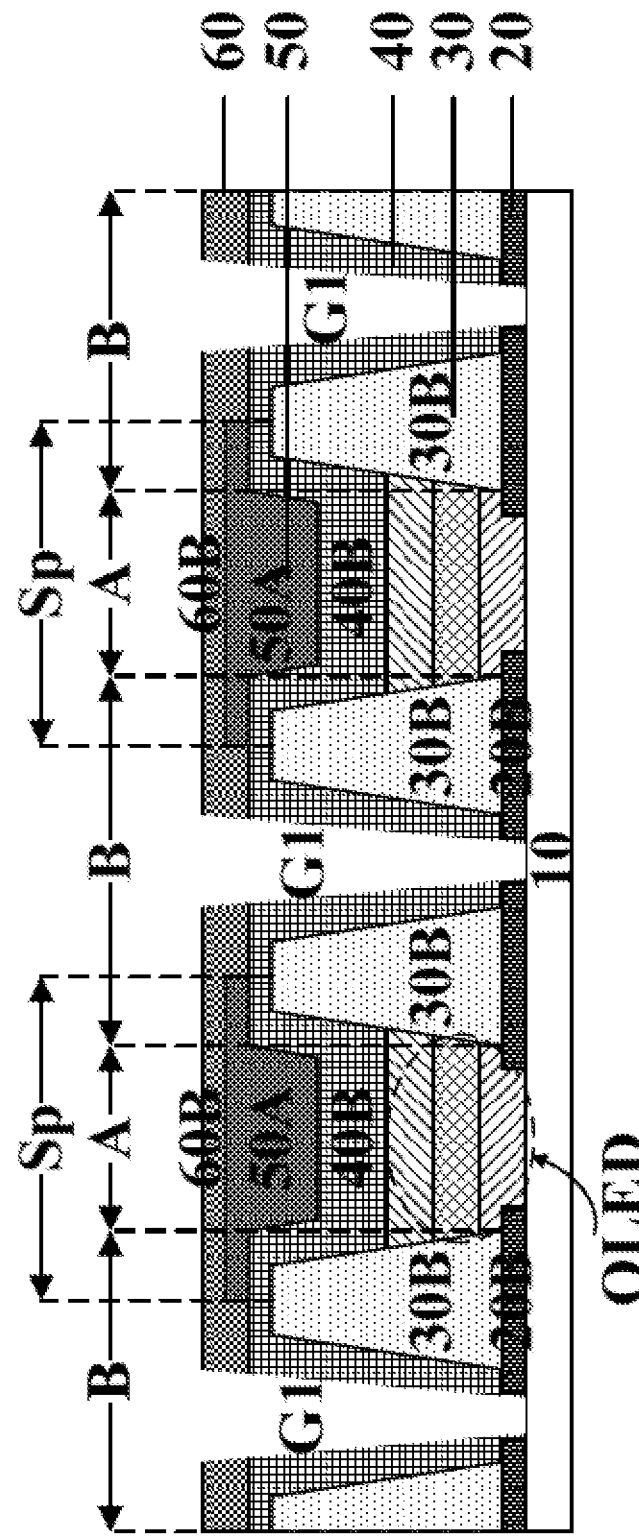
FIG. 2A is a schematic diagram illustrating an organic light emitting diode display panel in some embodiments according to the present disclosure.

FIG. 2A is a schematic diagram illustrating an organic light emitting diode display panel in some embodiments according to the present disclosure. Referring to FIG. 2A, in some embodiments, none of the encapsulating layers is a continuous layer extending throughout the plurality of sub-pixels Sp. Each of the encapsulating layers includes a plurality of encapsulating blocks even in the state as shown in FIG. 2A. In the initial state, the organic light emitting diode display panel in some embodiments includes a second inorganic encapsulating layer 40, which includes a plurality of second inorganic encapsulating blocks 40B. Adjacent second inorganic encapsulating blocks of the plurality of second inorganic encapsulating blocks 40B are spaced apart by a first gap G1 in the initial state. Optionally, the first gap G1 extends substantially through all of the encapsulating layer, exposing a portion of a surface of the base substrate 10.

Figure 2B:
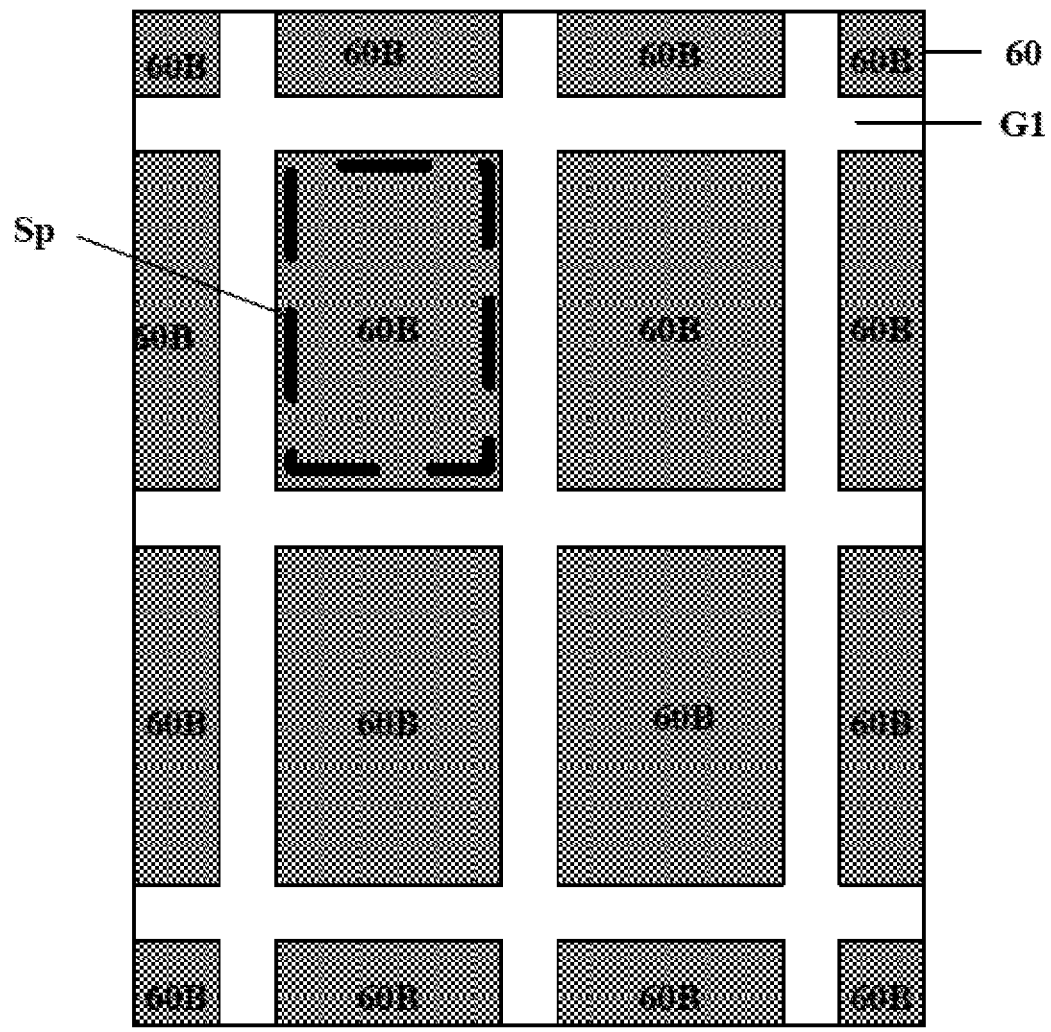
FIG. 2B is plan view of the organic light omitting diode display panel in some embodiments according to the present disclosure.

FIG. 2B is plan view of the organic light emitting diode display panel in same embodiments according to the present disclosure. Referring to FIG. 2A and FIG. 2B, the organic light emitting diode display panel in the initial state includes a plurality of third inorganic encapsulating blocks 60B spaced apart from each other by the first gap G1 in the inter-subpixel region B. Optionally, the organic encapsulating layer 50 includes only a plurality of first organic encapsulating blocks 50A, and does not include a plurality of second organic encapsulating blocks in an inter-subpixel region B. Each of the plurality of first organic encapsulating blocks 50A is at least partially in a subpixel region A.

Figure 2C:
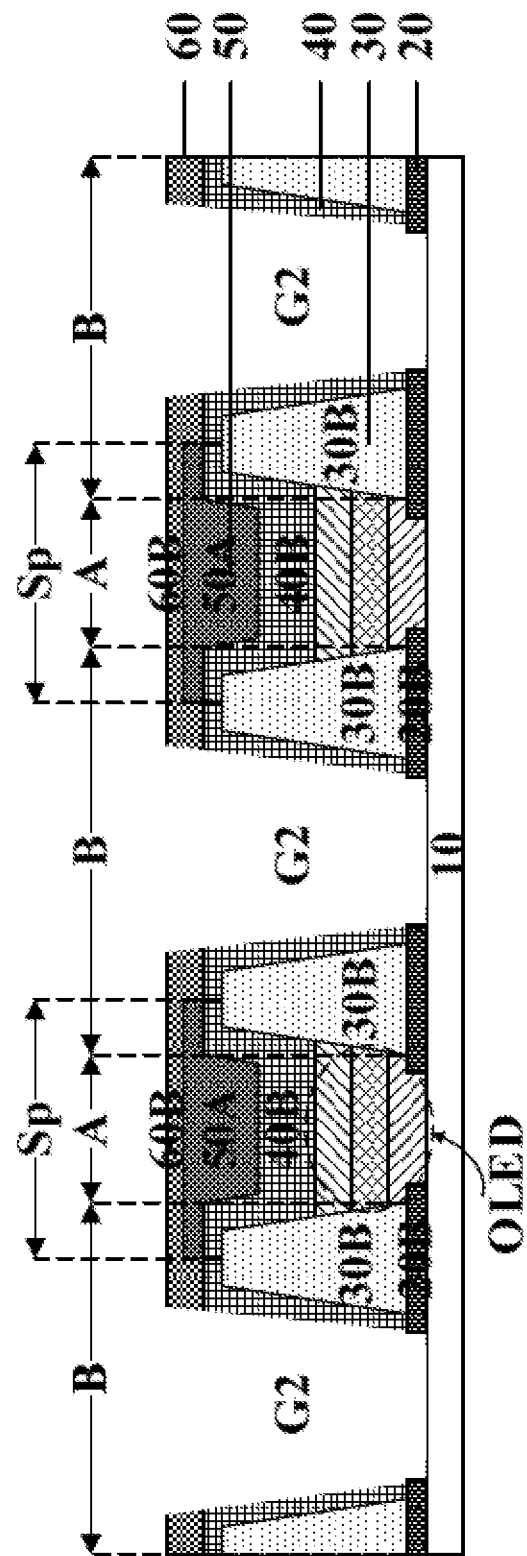
FIG. 2C is a schematic diagram illustrating an organic light emitting diode display panel in a stretched state in some embodiments according to the present disclosure.
Figure 2D:
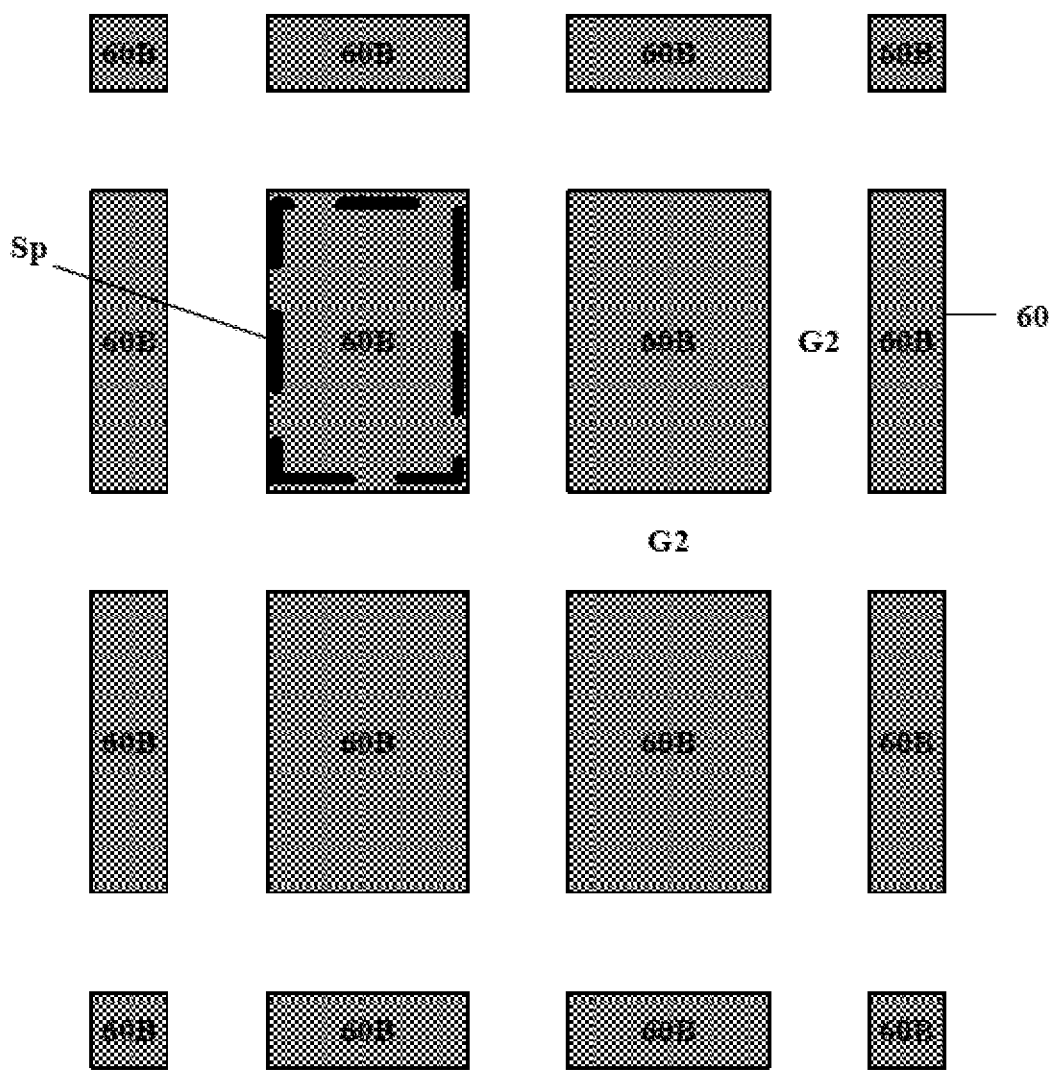
FIG. 2D is plan view of the organic light emitting diode display panel in a stretched state in some embodiments according to the present disclosure.
Figure 2E:
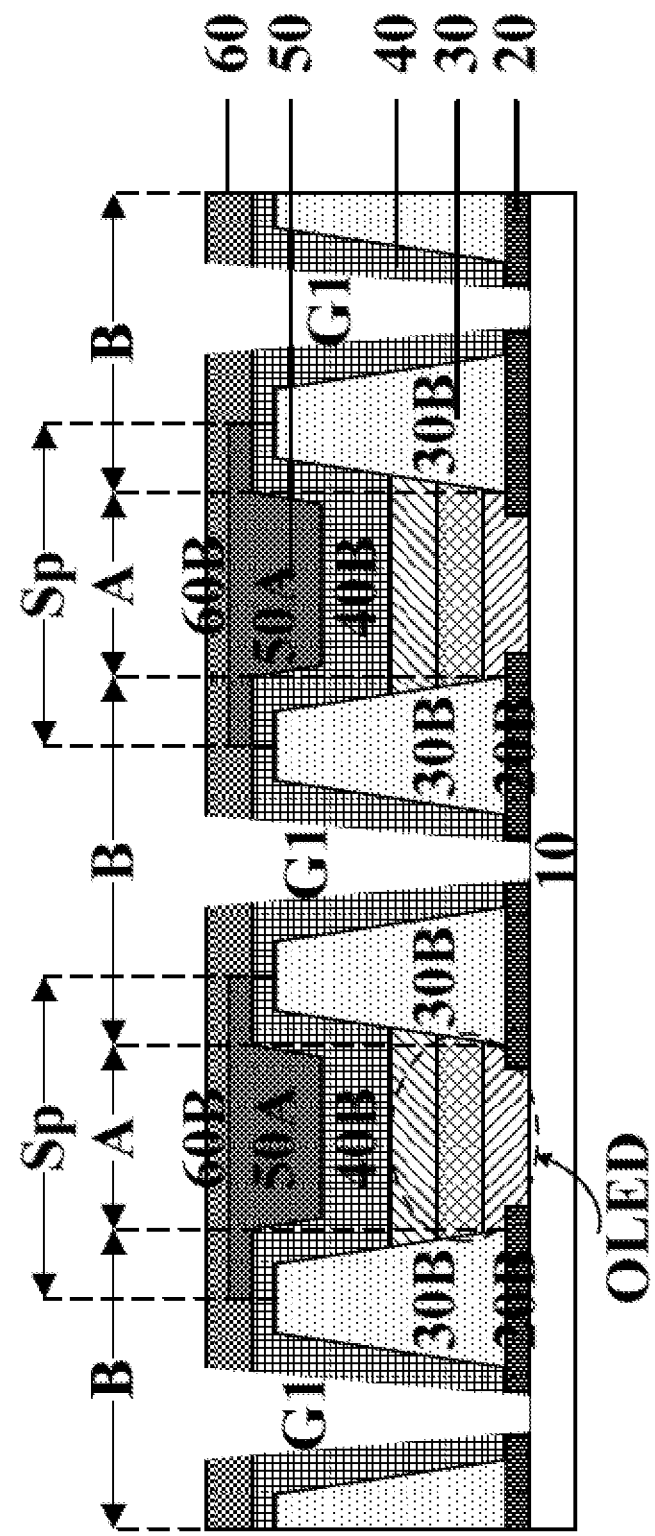
FIG. 2E is a schematic diagram illustrating an organic light emitting diode display panel in a substantially non-stretched state in some embodiments according to the present disclosure.

In some embodiments, the organic light emitting diode display panel is a stretchable display panel having a first substantially non-stretched state and a second stretched state. FIG. 2C is a schematic diagram illustrating an organic light emitting diode display panel in a stretched state in some embodiments according to the present disclosure. FIG. 2D is plan view of the organic light emitting diode display panel in a stretched state in some embodiments according to the present disclosure. FIG. 2E is a schematic diagram illustrating an organic light emitting diode display panel in a substantially non-stretched state in some embodiments according to the present disclosure. Referring to FIGS. 2C to 2E, in some embodiments, adjacent second inorganic encapsulating blocks of the plurality of second inorganic encapsulating blocks 40B are spaced apart by a first gap G1 in the first substantially non-stretched state, and are spaced apart by a second gap G2 in the second stretched state. Optionally, the second gap G2 has a second gap distance greater than a first gap distance of the first gap G1.

As shown in FIGS. 2C to 2E, in some embodiments, the third inorganic encapsulating layer 60 includes a plurality of third inorganic encapsulating blocks 60B. Adjacent third inorganic encapsulating blocks of the plurality of feud inorganic encapsulating blocks 60B are spaced apart by a first gap G1 in the first substantially non-stretched state, and are spaced apart by a second gap G2 in the second stretched state. The second gap G2 has a second gap distance greater than a first gap distance of the first gap G1.

Figure 3A:
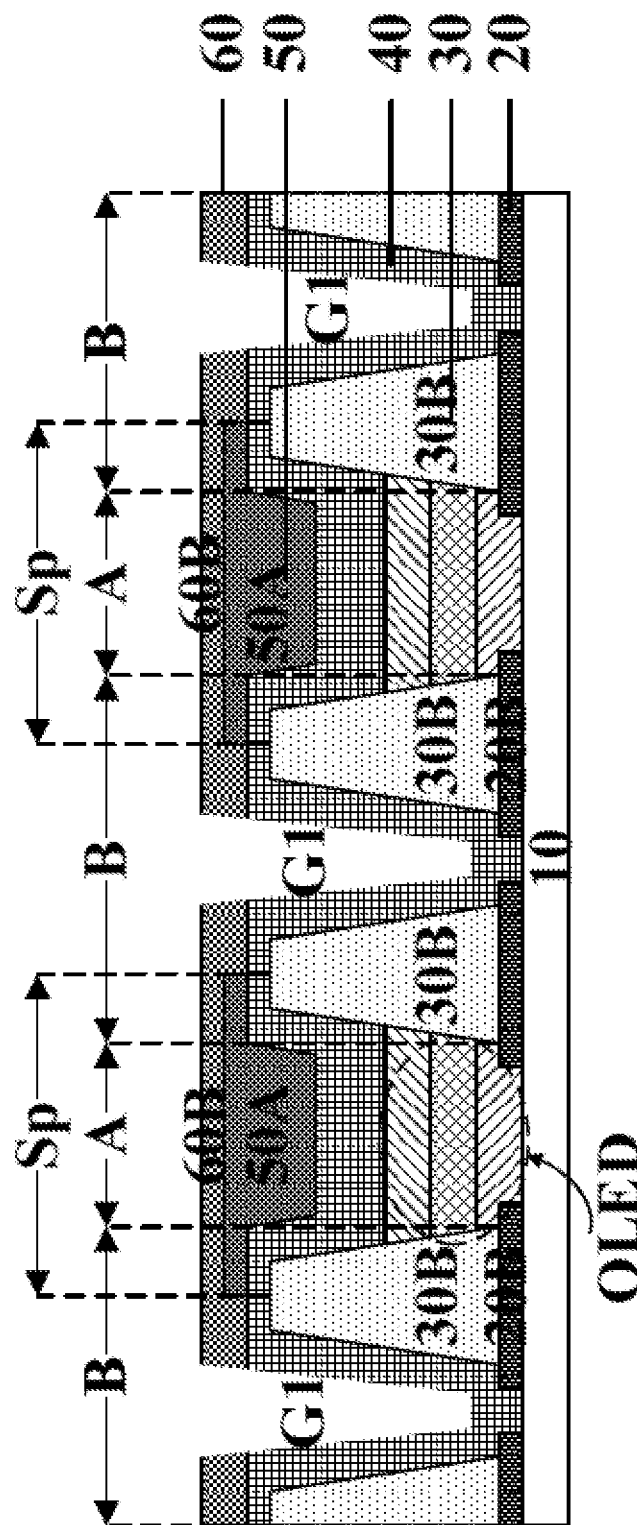
FIG. 3A is a schematic diagram illustrating an organic light emitting diode display panel in some embodiments according to the present disclosure.

FIG. 3A is a schematic diagram illustrating an organic light emitting diode display panel in some embodiments according to the peasant disclosure. The organic light emitting diode display panel in an initial state in FIG. 3A differs from the organic light emitting diode display panel in the initial state in FIG. 2A in that the second inorganic encapsulating layer 40 in the initial state in FIG. 3A is a contusions layer extending throughout the plurality of subpixels Sp, whereas the second inorganic encapsulating layer 40 in the initial state in FIG. 2A is not a continuous layer, and the first gap G1 in FIG. 3A does not extend through the second inorganic encapsulating layer 40 whereas the first gap G1 in FIG. 2A extends through all encapsulating layers. The second inorganic encapsulating layer 40 in the initial state in FIG. 3A is in direct contact with the base substrate 10 (e.g., a passivation layer).

Figure 3B:
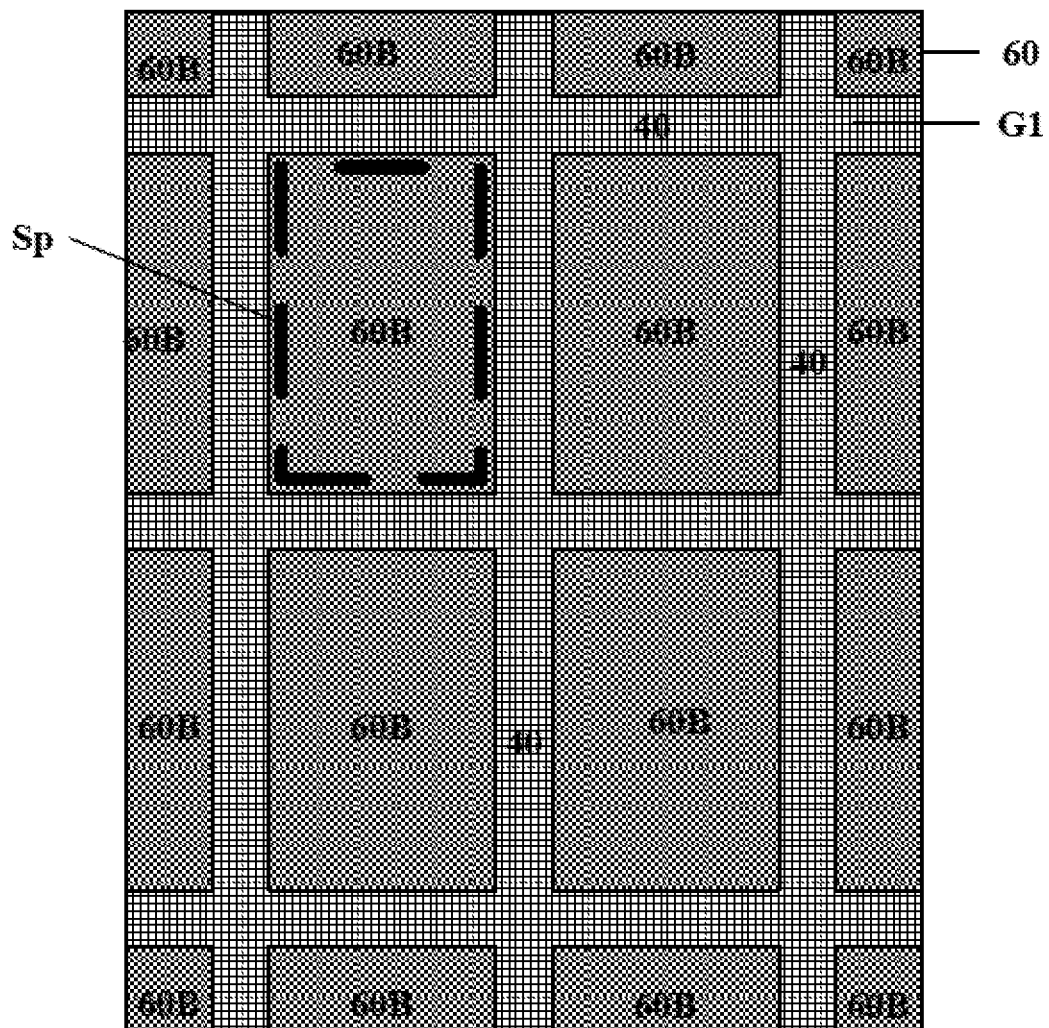
FIG. 3B is plan view of the organic light emitting diode display panel in some embodiments according to the present disclosure.

FIG. 3B is plan view of the organic light emitting diode display panel in some embodiments according to the present disclosure. Referring to FIG. 3A and FIG. 3B, the organic light emitting diode display panel in the initial state includes a plurality of third inorganic encapsulating blocks 60B spaced apart from each other by the first gap G1 in the inter-subpixel region B. Optionally, the organic encapsulating layer 50 includes only a plurality of first organic encapsulating blocks 50A, and does not include a plurality of second organic encapsulating blocks in an inter-subpixel region B. Each of the plurality of first organic encapsulating blocks 50A is at least partially in a subpixel region A. The organic light emitting diode display panel in an initial state in FIG. 3A differs from the organic light emitting diode display panel in the initial state in FIG. 1A in that the organic encapsulating layer 30 does not include a plurality of second organic encapsulating blocks 50B in the first gap G1.

Figure 3C:
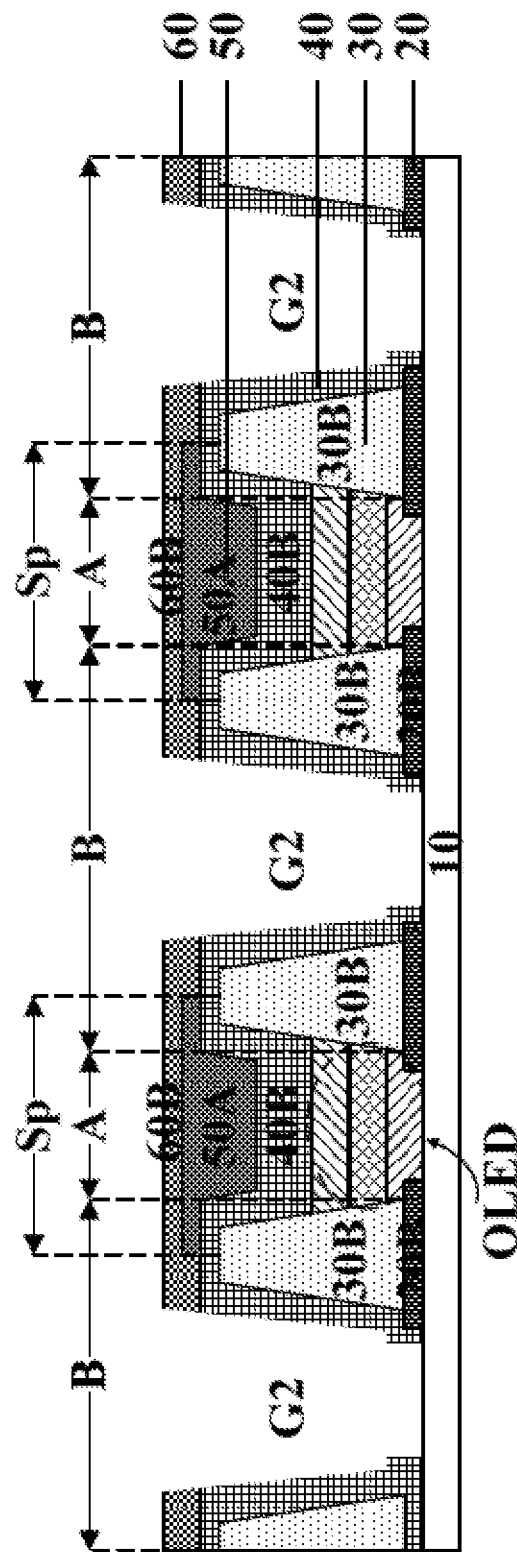
FIG. 3C is a schematic diagram illustrating an organic light emitting diode display panel in a stretched state in some embodiments according to the present disclosure.
Figure 3D:
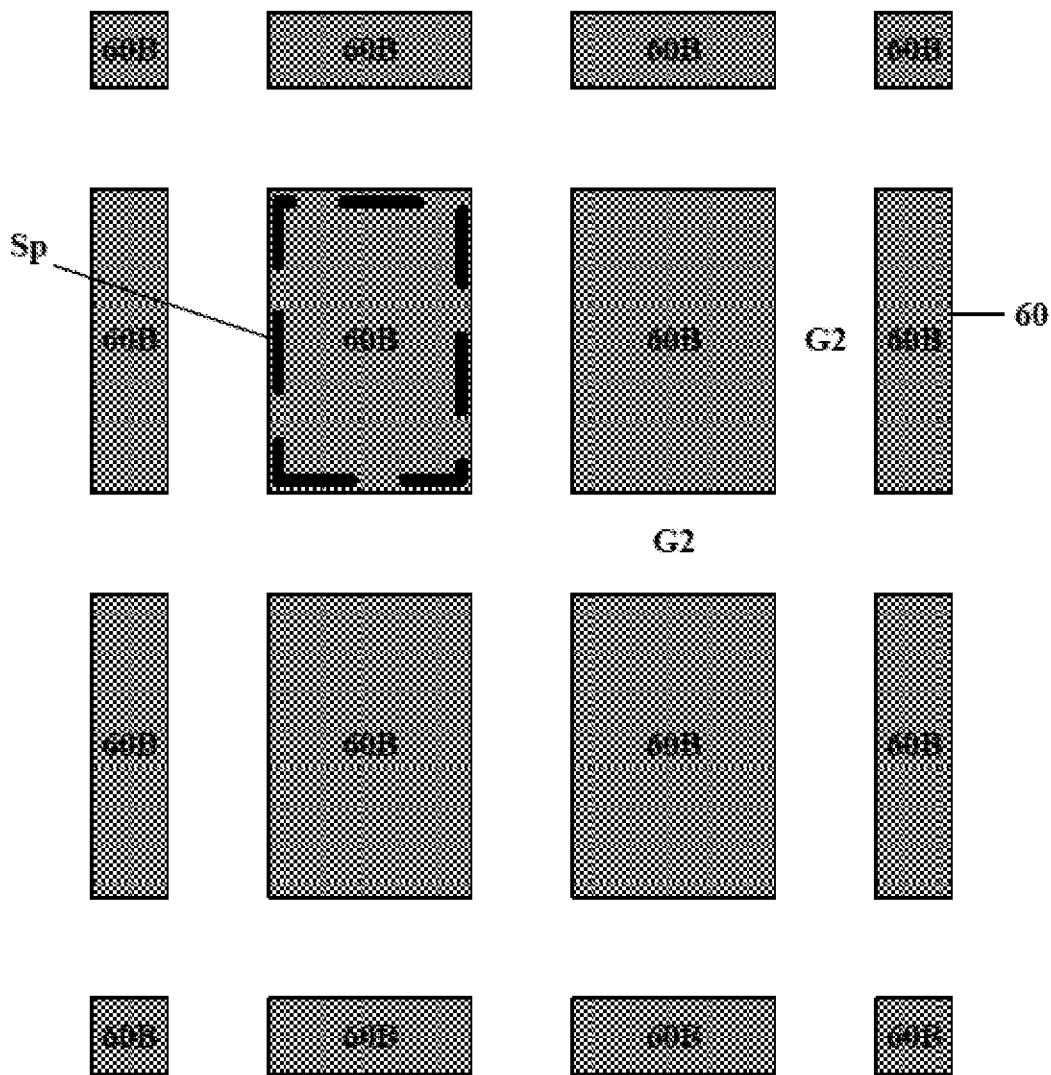
FIG. 3D is a plan view of the organic light emitting diode display panel in a stretched state in some embodiments according to the present disclosure.
Figure 3E:
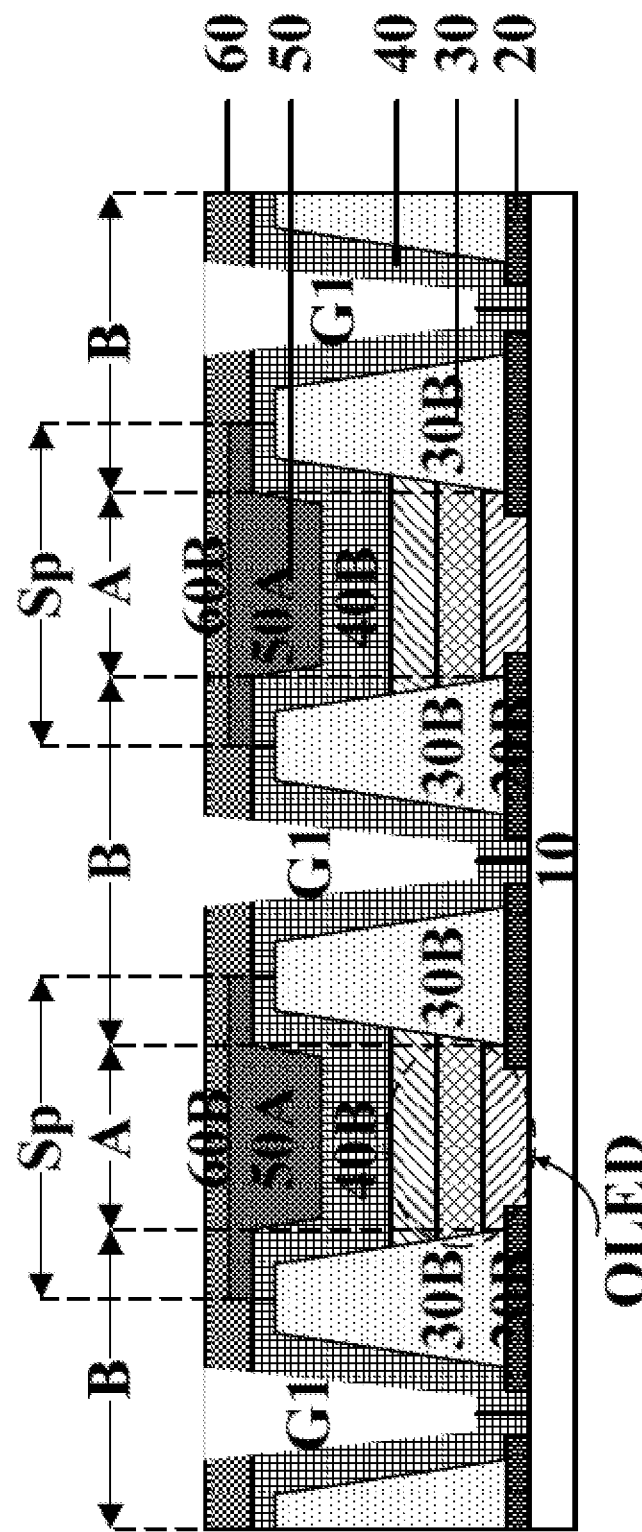
FIG. 3E is a schematic diagram illustrating an organic light emitting diode display panel in a substantially non-stretched state in some embodiments according to the present disclosure.

In same embodiments, the organic light emitting diode display panel is a stretchable display panel having a first substantially non-stretched state and a second stretched state. FIG. 3C is a schematic diagram illustrating an organic light emitting diode display panel in a stretched state in some embodiments according to the present disclosure. FIG. 3D is plan view of the organic light emitting diode display panel in a stretched state in some embodiments according to the present disclosure. FIG. 3E is a schematic, diagram illustrating an organic light emitting diode display panel in a substantially non-stretched state in some embodiments according to the present disclosure. Referring to FIGS. 3C to 3E, in some embodiments, adjacent second inorganic encapsulating blocks of the plurality of second inorganic encapsulating blocks 40B are spaced apart by a first gap G1 in the first substantially non-stretched state, and are spaced apart by a second gap G2 in the second stretched state. Optionally, the second gap G2 has a second gap distance greater than a first gap distance of the first gap G1. The organic light emitting diode display panel in FIGS. 3C to 3E differs from the organic light emitting diode display panel in FIGS. 2C to 2E in that the plurality of second encapsulating blocks 40B in FIGS. 3C to 3E are in direct contact with the base substrate 10, whereas the plurality of second encapsulating blocks 40B in FIGS. 2C to 2E are not in direct contact with the base substrate 10.

The organic light emitting diode display panel in FIGS. 3C to 3E differs from the organic light emitting diode display panel in FIGS. 1C to 1G in that the organic light emitting diode display panel in FIGS. 3C to 3E does not include one or more organic encapsulating blocks in the first gap G1 or in the second gap G2, whereas the organic light emitting diode display panel in FIGS. 1C to 1G includes one or more organic encapsulating blocks (e.g., one of the plurality of second organic encapsulating blocks 50B or two of the plurality of third organic encapsulating blocks 50'B) in the first gap G1 or in the second gap G2.

Figure 4A:
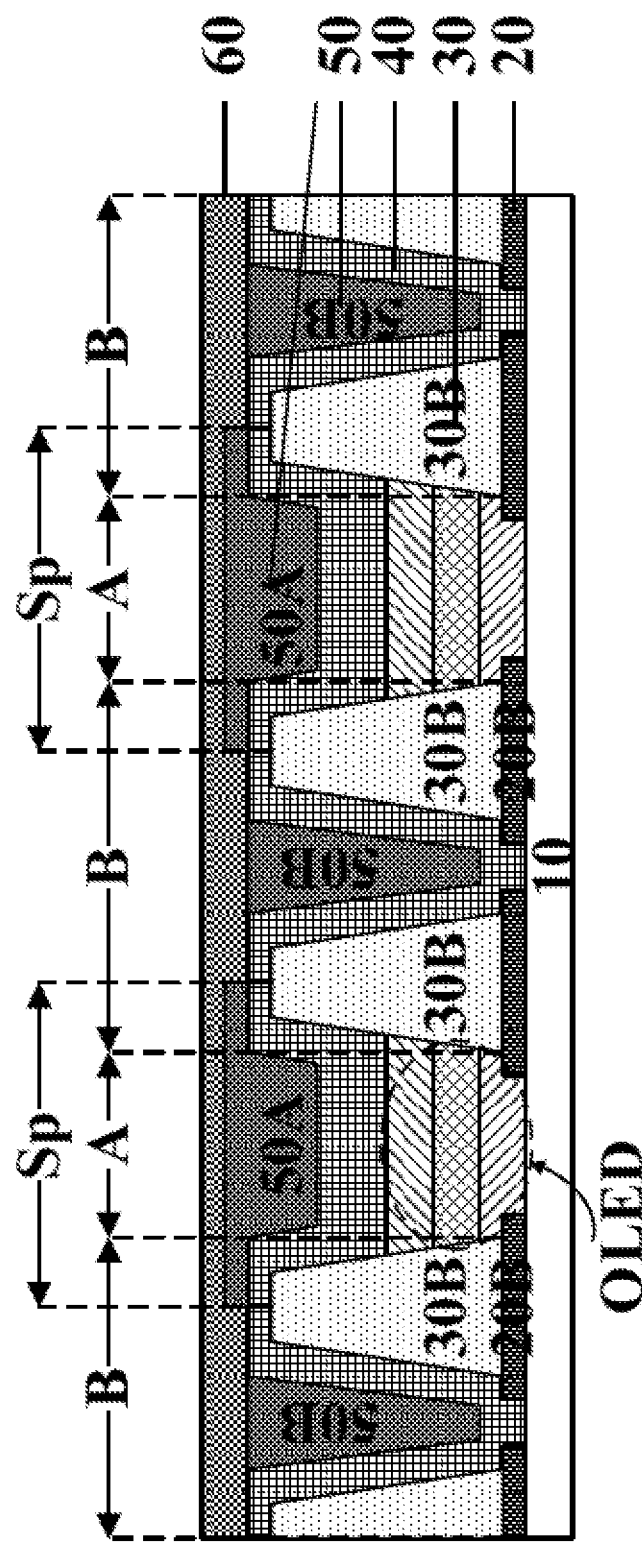
FIG. 4A is a schematic diagram illustrating an organic light emitting diode display panel in scene embodiments according to the present disclosure.
Figure 4B:
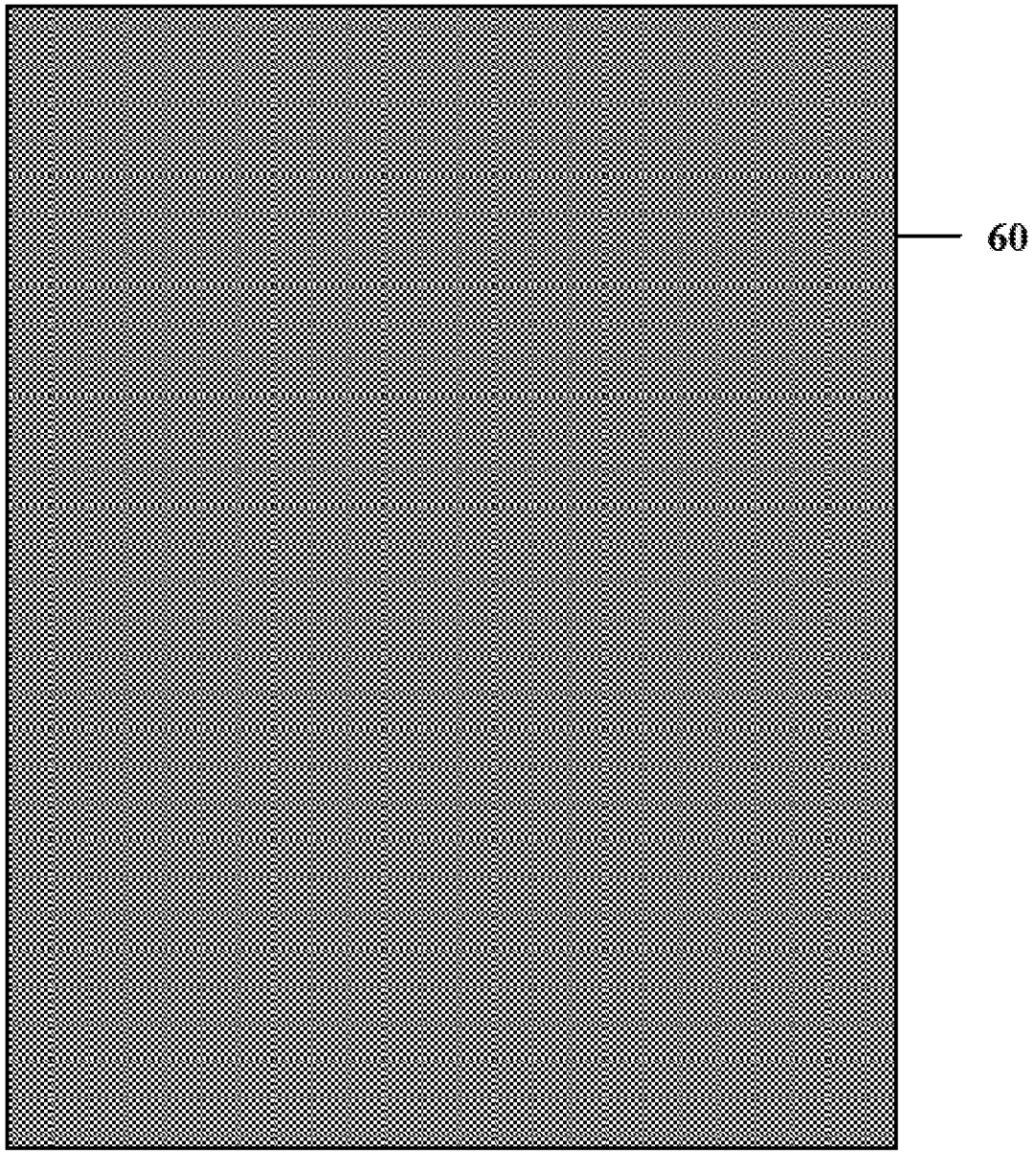
FIG. 4B is plan view of the organic light emitting diode display panel in some embodiments according to the present disclosure.

FIG. 4A is a schematic diagram illustrating an organic light emitting diode display panel in some embodiments according to the present disclosure. The organic light emitting diode display panel in an initial state in FIG. 4A differs from the initial state of the organic light emitting diode display panel in FIG. 1A in that the third inorganic encapsulating layer 60 in the initial state in FIG. 4A is a continuous layer extending throughout the plurality of subpixels Sp, whereas the third inorganic encapsulating layer 60 in the initial stale in FIG. 2A is not a continuous layer. FIG. 4B is plan view of the organic light emitting diode display panel in some embodiments according to the present disclosure. As shown in FIG. 4B, the entire surface of the organic light emitting diode display panel in the mitral state is covered by the third inorganic encapsulating layer 60.

Figure 4C:
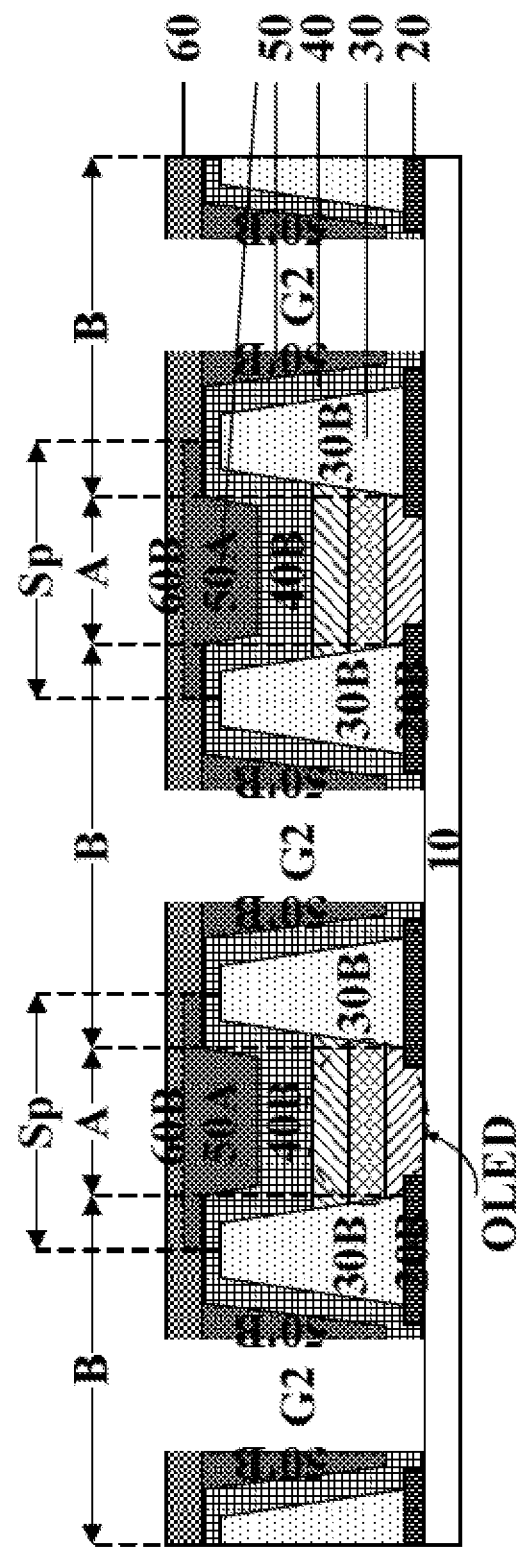
FIG. 4C is a schematic diagram illustrating an organic light emitting diode display panel in a stretched state in some embodiments according to the present disclosure.
Figure 4D:
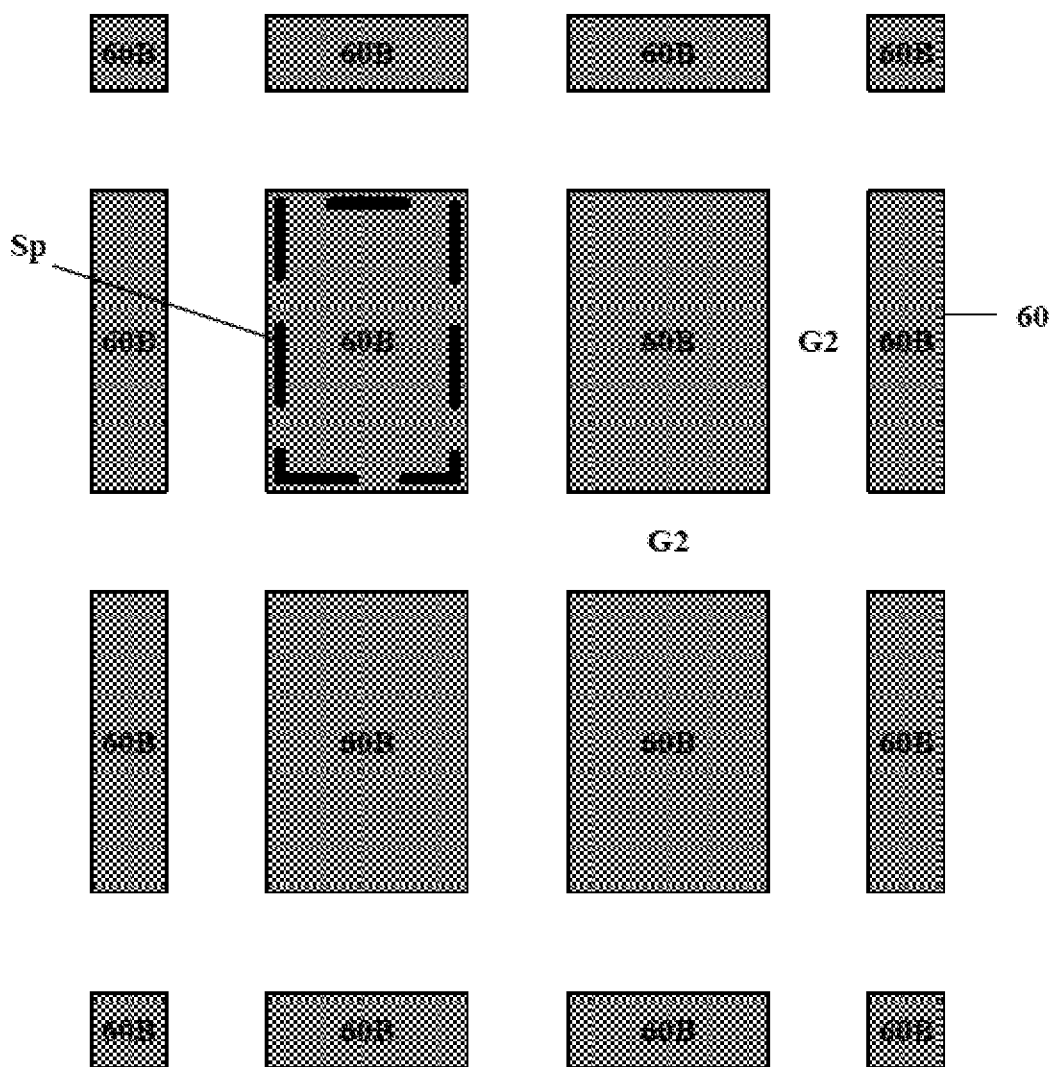
FIG. 4D is plan view of the organic light emitting diode display panel in a stretched state in some embodiments according to the present disclosure.
Figure 4E:
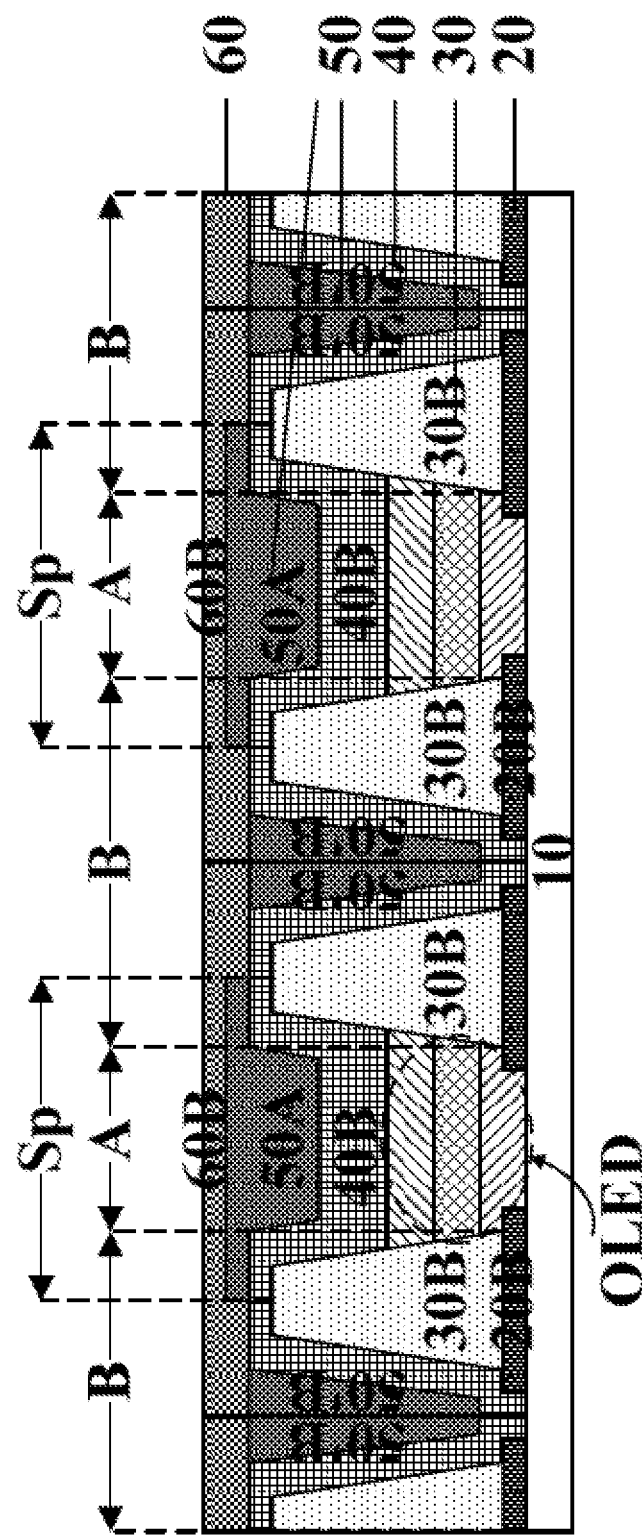
FIG. 4E is a schematic diagram illustrating an organic light emitting diode display panel in a substantially non-stretched state in some embodiments according to the present disclosure.

FIG. 4C is a schematic diagram illustrating an organic light emitting diode display panel in a stretched state in some embodiments according to the present disclosure. FIG. 4D is plan view of the organic light emitting diode display panel in a stretched state in some embodiments according to the present disclosure. FIG. 4E is a schematic diagram illustrating an organic light emitting diode display panel in a substantially nod-stretched state in some embodiments according to the present disclosure. The organic light emitting diode display panel in FIGS. 4C to 4E is similar to the organic light emitting diode display panel in FIGS. 1C to 1E. The organic light emitting diode display panel in FIGS. 4C to 4E differs from the organic light emitting diode display panel in FIGS. 1C to 1E in that an orthographic projection of the third inorganic encapsulating layer 60 in FIGS. 4C to 4E on the base substrate 10 substantially covers orthographic projections of the plurality of third organic encapsulating blocks 50'B on the base substrate 10, whereas the orthographic projection of the third inorganic encapsulating layer 60 in FIGS. 1C to 1E on the base substrate 10 is substantially non-overlapping with the orthographic projections of the plurality of third organic encapsulating blocks 50'B on the base substrate 10. For example, an orthographic projection of each of the plurality of third inorganic encapsulating blocks 60B in FIGS. 4C to 4E on the base substrate 10 substantially covers an orthographic projection of one of the plurality of third organic encapsulating blocks 50'B on the base substrate 10, whereas the orthographic projection of each of the plurality of third inorganic encapsulating blocks 60B in FIGS. 1C to 1E on the base substrate 10 is substantially non-overlapping with the orthographic projection of any of the plurality of third organic encapsulating blocks 50'B on the base substrate 10.

Figure 4F:
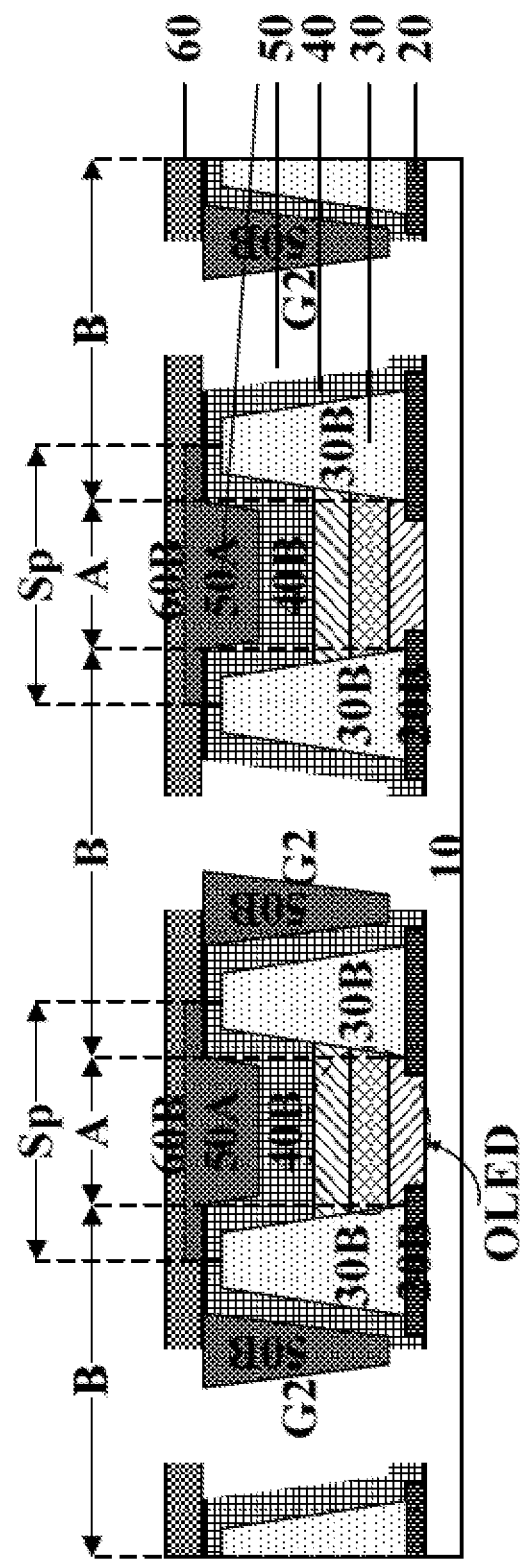
FIG. 4F is plan view of the atomic light emitting diode display panel in a stretched state in some embodiments according to the present disclosure.
Figure 4G:
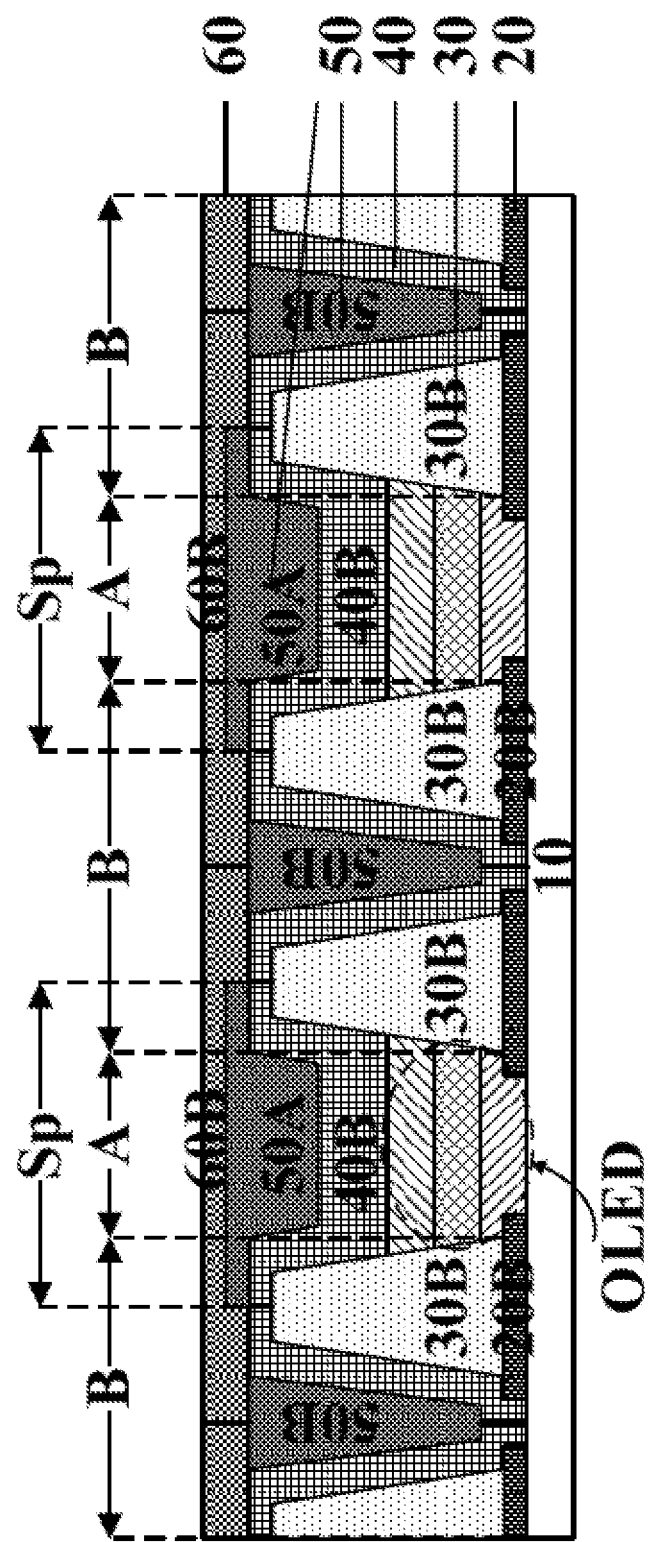
FIG. 4G is a schematic diagram illustrating an organic light matting diode display panel in a substantially non-stretched state in some embodiments according to the present disclosure.

FIG. 4F is plan view of the organic light emitting diode display panel in a stretched state in some embodiments according to the present disclosure. FIG. 4G is a schematic diagram illustrating an organic light emitting diode display panel in a substantially non-stretched state in some embodiments according to the present disclosure. The organic light emitting diode display panel in FIGS. 4F to 4G a similar to the organic light emitting diode display panel in FIGS. 1F to 1G. The organic light emitting diode display panel in FIGS. 4F to 4G differs from the organic light emitting diode display panel in FIGS. 1F to 1G in that adjacent third inorganic encapsulating blocks of the plurality of third inorganic encapsulating blocks 60B in FIGS. 4F to 4G are in direct contact with each other in the first substantially non-stretched state, and are spaced apart by a second gap G2 in the second stretched state, whereas adjacent third inorganic encapsulating blocks of the plurality of third inorganic encapsulating blocks 60B in FIGS. 1F to 1G are spaced apart by one of the plurality of second organic encapsulating blocks 50B in the first substantially non-stretched state, and are spaced apart by a second gap G2 in the second stretched state.

Optionally, the base substrate 10 is a stretchable base substrate. Optionally, one or more other layers of the organic light emitting diode display panel is a stretchable layer.

In some embodiments, the organic light emitting diode display panel includes a base substrate 10; a pixel definition layer 30 for defining a plurality of subpixels Sp on the base substrate 10; a plurality of organic light emitting diodes OLED respectively in the plurality of subpixels Sp; a first inorganic encapsulating layer 20 between the base substrate 10 and the pixel definition layer 30 configured to encapsulate the plurality of organic light emitting diodes OLED in the plurality of subpixels Sp; a second inorganic encapsulating layer 40 on a side of the plurality of organic light emitting diodes OLED and the pixel definition layer 30 distal to the first inorganic encapsulating layer 20; an organic encapsulating layer 50 on a side of the second inorganic encapsulating layer 40 distal to the base substrate 10; and a third inorganic encapsulating layer 60 on a side of the organic encapsulating layer 50 distal to the base substrate 10.

Optionally, the pixel definition layer 30 includes a plurality of pixel definition blocks 30B spaced apart from each other, each of the plurality of pixel definition blocks 30B is configured to define one of the plurality of subpixels Sp. Optionally, the first inorganic layer 20 includes a plurality of first inorganic encapsulating blocks 20B, each of the plurality of first inorganic encapsulating blocks 20B is between the base substrate 10 and one of the plurality of pixel definition, blocks 30B and configured to encapsulate one of the plurality of organic light emitting diodes OLED in one of the plurality of subpixels Sp. Optionally, an orthographic projection of each of the plurality of first inorganic encapsulating blocks 20B on the base substrate 10 substantially covers an orthographic projection of a periphery of one of the plurality of organic light emitting diodes OLED on the base substrate 10. Optionally, the second inorganic encapsulating layer 40 is in direct contact with a peripheral part (e g, an entirety of the peripheral port) of each of the plurality of first inorganic encapsulating blocks 20B thereby encapsulating the plurality of organic light emitting diodes OLED. Optionally, the organic encapsulating layer 30 includes a plurality of first organic encapsulating blocks 50A, each of which at least partially in a subpixel region A. Optionally, an orthographic projection of each of the plurality of first organic encapsulating blocks 30A on the base substrate 10 substantially covers an orthographic projection of one of toe plurality of organic light emitting diodes OLED on the base substrate 10.

In some embodiments, the organic light emitting diode display panel further includes a plurality of driving thin film transistors for driving light emission of the plurality of organic light emitting diodes. Optionally, the organic light emitting diode display panel further includes a plurality of switching thin film transistors configured to respectively control on/off switching of toe plurality of driving dun film transistors.

In another aspect, the present disclosure provides a method of fabricating an organic light emitting diode display panel. In some embodiments, the method includes forming a pixel definition layer far defining a plurality of subpixels on a base substrate; forming a plurality of organic light emitting diodes respectively in the plurality of subpixels; and forming a first inorganic encapsulating layer between toe base substrate and the pixel definition layer configured to encapsulate the plurality of organic light emitting diodes in the plurality of subpixels. Optionally, forming the pixel definition layer includes forming a plurality of pixel definition blocks spaced apart from each other, each of the plurality of pixel definition blocks is formed to define one of the plurality of subpixels. Optionally, forming the first inorganic encapsulating layer includes forming a plurality of first inorganic encapsulating blocks, each of the plurality of first inorganic encapsulating blocks is formed between the base substrate and one of the plurality of pixel definition blocks and formed to encapsulate one of the plurality of organic light emitting diodes in one of the plurality of subpixels. Optionally, the first inorganic encapsulating layer is formed so that an orthographic projection of each of the plurality of first inorganic encapsulating blocks on the base substrate substantially covers an orthographic projection of a periphery of one of the plurality of organic light emitting diodes on the base substrate, e.g., the orthographic projection of each of the plurality of first inorganic encapsulating blocks on the base substrate substantially covets an orthographic projection of a periphery of at least one layer in one of the plurality of organic light emitting diodes on the base substrate. Optionally, the first inorganic encapsulating layer is formed so that the orthographic projection of each of the plurality of first inorganic encapsulating blocks on the base substrate covers an orthographic projection of one of the plurality of pixel definition blocks on the base substrate.

In some embodiments, each of the plurality of organic light emitting diodes is formed to include a first electrode (e.g., on anode), a second electrode (e.g., a cathode), an organic light emitting layer between the first electrode and the second electrode. Optionally, each of the plurality of organic light emitting diodes is formed to further include one or more functional organic layers between the first electrode and the second electrode. Optionally, the second electrode is on a side of the organic light emitting layer distal to the first electrode. Optionally the first inorganic encapsulating layer is formed so that an orthographic projection of each of the plurality of first inorganic encapsulating blocks on the base substrate substantially covers an orthographic projection of a periphery of the first electrode in one of the plurality of organic light emitting diodes on the base substrate. Optionally, the first inorganic encapsulating layer is formed so that an orthographic projection of each of the plurality of first inorganic encapsulating blocks on the base substrate substantially covers an orthographic projection of a periphery of the second electrode in one of the plurality of organic light emitting diodes on the base substrate. Optionally, the first inorganic encapsulating layer is formed so that an orthographic projection of each of the plurality of first inorganic encapsulating blocks on the base substrate substantially covers an orthographic projection of a periphery of the organic light emitting layer in one of the plurality of organic light matting diodes on the base substrate. Optionally, the first inorganic encapsulating layer is formed so that an orthographic projection of each of the plurality of first inorganic encapsulating blocks on the base substrate substantially covers an orthographic projection of a periphery of any layer in one of the plurality of organic light emitting diodes on the base substrate. Optionally, the first inorganic encapsulating layer is formed so that an orthographic projection of each of the plurality of first inorganic encapsulating blocks on the base substrate is substantially non-overlapping with an orthographic projection of one or more layers in one of the plurality of organic light emitting diodes on the base substrate, but substantially covers an orthographic projection of a periphery of other layers in the one of the plurality of organic light emitting diodes on the base substrate.

In same embodiments, the method further includes forming a second inorganic encapsulating layer on a side of the plurality of organic light emitting diodes and the pixel definition layer distal to the first inorganic encapsulating layer. Optionally, the second inorganic encapsulating layer is formed to be in direct contact with a peripheral part (e.g., an entirety of the peripheral part) of each of the plurality of first inorganic encapsulating blocks thereby encapsulating the plurality of organic light emitting diodes.

In some embodiments, the second inorganic encapsulating layer is formed as a continuous layer extending throughout the plurality of subpixels.

In some embodiments, forming the second inorganic encapsulating layer includes forming a plurality of second inorganic encapsulating blocks. Optionally, each of the plurality of second inorganic encapsulating blocks is formed to be in direct contact with a peripheral part (e.g., an entirety of foe peripheral part) of one of the plurality of first inorganic encapsulating blocks thereby encapsulating the plurality of organic light emitting diodes. Optionally, the second inorganic encapsulating layer is formed so that an orthographic projection of each of the plurality of second inorganic encapsulating blocks on the base substrate substantially cavers a combination of an orthographic projection of one of the plurality of organic light emitting diodes on the base substrate, an orthographic projection of one of the plurality of first inorganic encapsulating blocks on the base substrate, and an orthographic projection of one of the plurality of pixel definition blocks on the base substrate.

In some embodiments, the method further includes forming an organic encapsulating layer on a side of the second inorganic encapsulating layer distal to the base substrate. Optionally, forming the organic encapsulating layer includes forming a plurality of first organic encapsulating blocks, each of which at least partially in a subpixel region. Optionally, the organic encapsulating layer u formed so that as orthographic projection of each of the plurality of first organic encapsulating blocks on the base substrate substantially covers an orthographic projection of one of the plurality of organic light emitting diodes on the base substrate.

In some embodiments, forming the organic encapsulating layer further includes forming a plurality of second organic encapsulating blocks in an inter-subpixel region. Optionally, forming the second inorganic encapsulating layer includes forming a plurality of second inorganic encapsulating blocks. Optionally, the organic encapsulating layer is formed so that each of the plurality of second organic encapsulating blocks is in a gap between adjacent second inorganic encapsulating blocks of the plurality of second inorganic encapsulating blocks, and attached to a side wall of one of the adjacent second inorganic encapsulating blocks of the plurality of second inorganic encapsulating blocks.

In some embodiments, forming the organic encapsulating layer further includes forming a plurality of third organic encapsulating blocks in an inter-subpixel region. Optionally, forming the second inorganic encapsulating layer includes forming a plurality of second inorganic encapsulating blocks. Optionally, the organic encapsulating layer is formed so that two of the plurality of third organic encapsulating blocks is in a gap between the adjacent second inorganic encapsulating blocks of the plurality of second inorganic encapsulating blocks, each of which attached to a side wall of one of the adjacent second inorganic encapsulating blocks of the plurality of second inorganic encapsulating blocks.

In some embodiments, the method further includes forming a third inorganic encapsulating layer on a side of the organic encapsulating layer distal to the base substrate.

In some embodiments, the third inorganic encapsulating layer is formed as a continuous layer extending throughout the plurality of subpixels.

In some embodiments, forming the third inorganic encapsulating layer includes forming a plurality of third inorganic encapsulating blocks. Optionally, each of the plurality of third inorganic encapsulating blocks is formed to be in direct contact with the second inorganic encapsulating layer and in direct contact with one of the plurality of first organic encapsulating blocks. Optionally, the third inorganic encapsulating layer is formed so that an orthographic projection of each of the plurality of third inorganic encapsulating blocks an the base substrate substantially covers a combination of an orthographic projection of one of the plurality of organic light emitting diodes on the base substrate and an orthographic projection of one of the plurality of first organic encapsulating blocks on the base substrate.

In another aspect the present disclosure provides an organic light emitting diode display apparatus having an organic light emitting diode display panel described herein or fabricated by a method described herein. Examples of appropriate display apparatuses include, but are not limited to, an electronic paper, a mobile phone, a tablet computer, a television, a monitor, a notebook computer, a digital album, a GPS, etc. In one example, the display apparatus is a smart watch.

Optionally, the organic light emitting diode display apparatus is a wearable display apparatus, e.g., a smart watch.

The foregoing description of the embodiments of the inversion has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled the art to understand the invention for various embodiments and with various modifications as are suited to the particular use or implementation contemplated. It is intended that the scope of the invention be defined by the claims appended hereto and their equivalents in which all tarns are meant m their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode display panel, comprising:
    a base substrate;
    a pixel definition layer for defining a plurality of subpixels on the base substrate;
    a plurality of organic light emitting diodes respectively in the plurality of subpixels;
    a first inorganic encapsulating layer between the base substrate and the pixel definition layer configured to encapsulate the plurality of organic light emitting diodes in the plurality of subpixels; and
    a second inorganic encapsulating layer on a side of the plurality of organic light emitting diodes and the pixel definition layer distal to the first inorganic encapsulating layer;
    wherein the pixel definition layer comprises a plurality of pixel definition blocks spaced apart from each other, each of the plurality of pixel definition blocks is configured to define one of the plurality of subpixels;
    the first inorganic encapsulating layer comprises a plurality of first inorganic encapsulating blocks, each of the plurality of first inorganic encapsulating blocks is between the base substrate and one of the plurality of pixel definition blocks and configured to encapsulate one of the plurality of organic light emitting diodes in one of the plurality of subpixels;
    an orthographic projection of each of the plurality of first inorganic encapsulating blocks on the base substrate substantially covers an orthographic projection of a periphery of one of the plurality of organic light emitting diodes on the base substrate;
    the second inorganic encapsulating layer is in direct contact with a peripheral part of each of the plurality of first inorganic encapsulating blocks thereby encapsulating the plurality of organic light emitting diodes;
    the second inorganic encapsulating layer comprises a plurality of second inorganic encapsulating blocks;
    each of the plurality of second inorganic encapsulating blocks is in direct contact with a peripheral part of one of the plurality of first inorganic encapsulating blocks thereby encapsulating the plurality of organic light emitting diodes;
    an orthographic projection of each of the plurality of second inorganic encapsulating blocks on the base substrate substantially covers a combination of an orthographic projection of one of the plurality of organic light emitting diodes on the base substrate, an orthographic projection of one of the plurality of first inorganic encapsulating blocks on the base substrate, and an orthographic projection of one of the plurality of pixel definition blocks on the base substrate;
    the organic light emitting diode display panel is a stretchable display panel having a first substantially non-stretched state and a second stretched state; and
    adjacent second inorganic encapsulating blocks of the plurality of second inorganic encapsulating blocks are spaced apart by a first gap in the first substantially non-stretched state, and are spaced apart by a second gap in the second stretched state, the second gap has a second gap distance greater than a first gap distance of the first gap.

2. The organic light emitting diode display panel of claim 1, wherein the orthographic projection of each of the plurality of first inorganic encapsulating blocks on the base substrate substantially covers an orthographic projection of one of the plurality of pixel definition blocks on the base substrate.

3. The organic light emitting diode display panel of claim 1, wherein the second inorganic encapsulating layer is a continuous layer extending throughout the plurality of subpixels.

4. The organic light emitting diode display panel of claim 1, further comprising an organic encapsulating block in the first gap and in the second gap, and attached to a side wall of one of the adjacent second inorganic encapsulating blocks of the plurality of second inorganic encapsulating blocks.

5. The organic light emitting diode display panel of claim 1, further comprising two organic encapsulating blocks in the first gap and in the second gap, each of which attached to a side wall of one of the adjacent second inorganic encapsulating blocks of the plurality of second inorganic encapsulating blocks.

6. The organic light emitting diode display panel of claim 1, further comprising an organic encapsulating layer on a side of the second inorganic encapsulating layer distal to the base substrate;
    wherein the organic encapsulating layer comprises a plurality of first organic encapsulating blocks, each of which at least partially in a subpixel region; and
    an orthographic projection of each of the plurality of first organic encapsulating blocks on the base substrate substantially covers an orthographic projection of one of the plurality of organic light emitting diodes on the base substrate.

7. An organic light emitting diode display panel, comprising:
    a base substrate;
    a pixel definition layer for defining a plurality of subpixels on the base substrate;
    a plurality of organic light emitting diodes respectively in the plurality of subpixels;
    a first inorganic encapsulating layer between the base substrate and the pixel definition layer configured to encapsulate the plurality of organic light emitting diodes in the plurality of subpixels;
    a second inorganic encapsulating layer on a side of the plurality of organic light emitting diodes and the pixel definition layer distal to the first inorganic encapsulating layer; and
    an organic encapsulating layer on a side of the second inorganic encapsulating layer distal to the base substrate;
    wherein the pixel definition layer comprises a plurality of pixel definition blocks spaced apart from each other, each of the plurality of pixel definition blocks is configured to define one of the plurality of subpixels;
    the first inorganic encapsulating layer comprises a plurality of first inorganic encapsulating blocks, each of the plurality of first inorganic encapsulating blocks is between the base substrate and one of the plurality of pixel definition blocks and configured to encapsulate one of the plurality of organic light emitting diodes in one of the plurality of subpixels;

an orthographic projection of each of the plurality of first inorganic encapsulating blocks on the base substrate substantially covers an orthographic projection of a periphery of one of the plurality of organic light emitting diodes on the base substrate;

the second inorganic encapsulating layer is in direct contact with a peripheral part of each of the plurality of first inorganic encapsulating blocks thereby encapsulating the plurality of organic light emitting diodes;

the organic encapsulating layer comprises a plurality of first organic encapsulating blocks, each of which at least partially in a subpixel region; and an orthographic projection of each of the plurality of first organic encapsulating blocks on the base substrate substantially covers an orthographic projection of one of the plurality of organic light emitting diodes on the base substrate;

wherein the organic encapsulating layer further comprises a plurality of second organic encapsulating blocks in an inter-subpixel region;

the second inorganic encapsulating layer comprises a plurality of second inorganic encapsulating blocks; and each of the plurality of second organic encapsulating blocks is in a gap between adjacent second inorganic encapsulating blocks of the plurality of second inorganic encapsulating blocks, and attached to a side wall of one of the adjacent second inorganic encapsulating blocks of the plurality of second inorganic encapsulating blocks.

8. The organic light emitting diode display panel of claim 7, wherein the organic light emitting diode display panel is a stretchable display panel having a first substantially non-stretched state and a second stretched state;

adjacent second inorganic encapsulating blocks of the plurality of second inorganic encapsulating blocks are spaced apart by a first gap in the first substantially non-stretched state, and are spaced apart by a second gap in the second stretched state, the second gap has a second gap distance greater than a first gap distance of the first gap;

each of the plurality of second organic encapsulating blocks in the first substantially non-stretched state substantially fills in the first gap.

9. The organic light emitting diode display panel of claim 6, wherein the organic encapsulating layer further comprises a plurality of third organic encapsulating blocks in an inter-subpixel region;

the second inorganic encapsulating layer comprises a plurality of second inorganic encapsulating blocks;

two of the plurality of third organic encapsulating blocks is in a gap between adjacent second inorganic encapsulating blocks of the plurality of second inorganic encapsulating blocks, each of which attached to a side wall of one of the adjacent second inorganic encapsulating blocks of the plurality of second inorganic encapsulating blocks.

10. The organic light emitting diode display panel of claim 9, wherein the organic light emitting diode display panel is a stretchable display panel having a first substantially non-stretched state and a second stretched state;

adjacent second inorganic encapsulating blocks of the plurality of second inorganic encapsulating blocks are spaced apart by a first gap in the first substantially non-stretched state, and are spaced apart by a second gap in the second stretched state, the second gap has a second gap distance greater than a first gap distance of the first gap;

two of the plurality of third organic encapsulating blocks substantially fills in the first gap in the first substantially non-stretched state.

11. The organic light emitting diode display panel of claim 6, further comprising a third inorganic encapsulating layer on a side of the organic encapsulating layer distal to the base substrate.

12. The organic light emitting diode display panel of claim 1, wherein the base substrate is a stretchable base substrate.

13. An organic light emitting diode display apparatus, comprising the organic light emitting diode display panel of claim 1.

14. The organic light emitting diode display apparatus of claim 13, wherein the organic light emitting diode display apparatus is a wearable display apparatus.

15. A method of fabricating an organic light emitting diode display panel, comprising:

forming a pixel definition layer for defining a plurality of subpixels on a base substrate;

forming a plurality of organic light emitting diodes respectively in the plurality of subpixels;

forming a first inorganic encapsulating layer between the base substrate and the pixel definition layer configured to encapsulate the plurality of organic light emitting diodes in the plurality of subpixels; and forming a second inorganic encapsulating layer on a side of the plurality of organic light emitting diodes and the pixel definition layer distal to the first inorganic encapsulating layer;

wherein forming the pixel definition layer comprises forming a plurality of pixel definition blocks spaced apart from each other, each of the plurality of pixel definition blocks is formed to define one of the plurality of subpixels;

forming the first inorganic encapsulating layer comprises forming a plurality of first inorganic encapsulating blocks, each of the plurality of first inorganic encapsulating blocks is formed between the base substrate and one of the plurality of pixel definition blocks and formed to encapsulate one of the plurality of organic light emitting diodes in one of the plurality of subpixels; and the first inorganic encapsulating layer is formed so that an orthographic projection of each of the plurality of first inorganic encapsulating blocks on the base substrate substantially covers an orthographic projection of a periphery of one of the plurality of organic light emitting diodes on the base substrate;

the second inorganic encapsulating layer is in direct contact with a peripheral part of each of the plurality of first inorganic encapsulating blocks thereby encapsulating the plurality of organic light emitting diodes;

the second inorganic encapsulating layer comprises a plurality of second inorganic encapsulating blocks;

each of the plurality of second inorganic encapsulating blocks is in direct contact with a peripheral part of one of the plurality of first inorganic encapsulating blocks thereby encapsulating the plurality of organic light emitting diodes;

an orthographic projection of each of the plurality of second inorganic encapsulating blocks on the base substrate substantially covers a combination of an orthographic projection of one of the plurality of organic light emitting diodes on the base substrate, an orthographic projection of one of the plurality of first inorganic encapsulating blocks on the base substrate, and an orthographic projection of one of the plurality of pixel definition blocks on the base substrate;

the organic light emitting diode display panel is a stretchable display panel having a first substantially non-stretched state and a second stretched state; and adjacent second inorganic encapsulating blocks of the plurality of second inorganic encapsulating blocks are spaced apart by a first gap in the first substantially non-stretched state, and are spaced apart by a second gap in the second stretched state, the second gap has a second gap distance greater than a first gap distance of the first gap.

* * * * *